(12) United States Patent
Cha et al.

(10) Patent No.: US 12,557,680 B2
(45) Date of Patent: Feb. 17, 2026

(54) INTEGRATED CIRCUIT DEVICE

(71) Applicant: SAMSUNG ELECTRONICS CO., LTD., Suwon-si (KR)

(72) Inventors: Seungmin Cha, Suwon-si (KR); Seungmin Song, Suwon-si (KR); Youngwoo Kim, Suwon-si (KR); Jinkyu Kim, Suwon-si (KR); Sora You, Suwon-si (KR); Namhyun Lee, Suwon-si (KR); Sungmoon Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 474 days.

(21) Appl. No.: 18/106,540

(22) Filed: Feb. 7, 2023

(65) Prior Publication Data

US 2024/0047339 A1    Feb. 8, 2024

(30) Foreign Application Priority Data

Aug. 2, 2022   (KR) .................. 10-2022-0096269

(51) Int. Cl.
*H01L 23/50*   (2006.01)
*H01L 23/522*   (2006.01)
(Continued)

(52) U.S. Cl.
CPC .......... *H01L 23/50* (2013.01); *H01L 23/5226* (2013.01); *H01L 23/5286* (2013.01); *H01L 23/535* (2013.01); *H10D 30/024* (2025.01); *H10D 30/62* (2025.01); *H10D 64/017* (2025.01); *H10D 64/513* (2025.01); *H10D 84/834* (2025.01); *H10D 84/853* (2025.01)

(58) Field of Classification Search
CPC ....... H01L 21/76895; H01L 21/823475; H01L 21/76898; H01L 23/5226; H01L 23/535; H01L 23/481; H01L 23/5286; H01L 23/49827; H10D 30/014; H10D 30/43; H10D 30/62; H10D 30/6735; H10D 84/834; H10D 84/853
See application file for complete search history.

(56) References Cited

U.S. PATENT DOCUMENTS 10,700,207 B2   6/2020  Chen et al.
11,121,086 B2   9/2021  Hiblot et al.
(Continued)

OTHER PUBLICATIONS

Extended European Search Report in European Appln. No. 23168561.1, mailed on Feb. 2, 2024, 13 pages.

*Primary Examiner* — Tuan A Hoang
(74) *Attorney, Agent, or Firm* — Fish & Richardson P.C.

(57) ABSTRACT

An integrated circuit device includes a substrate, having a front surface and a rear surface opposite to each other, and a fin-type active region defined by a trench in the front surface, a device separation layer filling the trench, a source/drain region on the fin-type active region, a first conductive plug arranged on the source/drain region and electrically connected to the source/drain region, a power wiring line at least partially arranged on a lower surface of the substrate, a buried rail connected to the power wiring line through the device separation layer and decreasing in horizontal width toward the power wiring line, and a power via connecting the buried rail to the first conductive plug.

20 Claims, 40 Drawing Sheets

(51) Int. Cl.
*H01L 23/528* (2006.01)
*H01L 23/535* (2006.01)
*H10D 30/01* (2025.01)
*H10D 30/62* (2025.01)
*H10D 64/01* (2025.01)
*H10D 64/27* (2025.01)
*H10D 84/83* (2025.01)
*H10D 84/85* (2025.01)

(56) References Cited

U.S. PATENT DOCUMENTS

| | | |
|---|---|---|
| 11,177,286 B2 | 11/2021 | Kim et al. |
| 11,239,208 B2 | 2/2022 | Chuang et al. |
| 2015/0102497 A1* | 4/2015 | Park ................. H01L 21/76898 257/774 |
| 2019/0067091 A1 | 2/2019 | Morrow et al. |
| 2021/0028112 A1* | 1/2021 | Kim .................... H10D 84/0158 |
| 2021/0336063 A1 | 10/2021 | Liao et al. |
| 2021/0343639 A1 | 11/2021 | Wang et al. |
| 2021/0358848 A1 | 11/2021 | Wu et al. |
| 2021/0375722 A1 | 12/2021 | Kim et al. |
| 2022/0058327 A1 | 2/2022 | Yang et al. |
| 2022/0208679 A1 | 6/2022 | Lee et al. |
| 2023/0178433 A1* | 6/2023 | Xie ....................... H01L 23/535 257/621 |

* cited by examiner

INTEGRATED CIRCUIT DEVICE

CROSS-REFERENCE TO RELATED APPLICATION

This application is based on and claims priority under 35 U.S.C. § 119 to Korean Patent Application No. 10-2022-0096269, filed on Aug. 2, 2022, in the Korean Intellectual Property Office, the disclosure of which is incorporated by reference herein in its entirety.

BACKGROUND

The disclosure relates to an integrated circuit device and, more particularly, to an integrated circuit device having a power delivery network (PDN).

With the development of electronics technology, downscaling of integrated circuit devices is rapidly progressing. To efficiently transmit power to highly integrated circuit devices, integrated circuit devices having PDNs have been introduced.

SUMMARY

The disclosure provides an integrated circuit device having a power delivery network (PDN) capable of reliably transmitting power in a highly integrated circuit device.

The disclosure provides the following integrated circuit devices.

According to an aspect of the disclosure, there is provided an integrated circuit device including a substrate having a front surface and a rear surface, opposite to each other, and a fin-type active region defined by a trench in the front surface, a device separation layer filling the trench, a source/drain region on the fin-type active region, a first conductive plug arranged on the source/drain region and electrically connected to the source/drain region, a power wiring line at least partially arranged on a lower surface of the substrate, a buried rail connected to the power wiring line through the device separation layer and decreasing in horizontal width toward the power wiring line, and a power via connecting the buried rail to the first conductive plug.

According to another aspect of the disclosure, there is provided an integrated circuit device including a substrate having a front surface and a rear surface, opposite to each other, and a fin-type active region defined by a trench in the front surface, a device separation layer filling the trench, a source/drain region on the fin-type active region, a plurality of gate electrodes extending to cross the fin-type active region, an inter-gate insulating layer covering the source/drain region and filling between the plurality of gate electrodes, a first conductive plug arranged on the source/drain region and electrically connected to the source/drain region, a power wiring line at least partially arranged on a lower surface of the substrate, a first power hole passing through the device separation layer, a first insulating barrier covering inner side surfaces of the first power hole with a first thickness, a buried rail surrounded by the first insulating barrier and electrically connected to the power wiring line, a second power hole passing through the inter-gate insulating layer, a second insulating barrier covering inner side surfaces of the second power hole with a second thickness that is less than the first thickness, and a power via surrounded by the second insulating barrier and connecting the buried rail to the first conductive plug.

According to another aspect of the disclosure, there is provided an integrated circuit device including a substrate having a front surface and a rear surface, opposite to each other, and a fin-type active region defined by a trench in the front surface, a device separation layer filling the trench, a source/drain region on the fin-type active region, a plurality of gate electrodes extending to cross the fin-type active region, an inter-gate insulating layer covering the source/drain region and filling between the plurality of gate electrodes, a first conductive plug arranged on the source/drain region and electrically connected to the source/drain region, a power wiring line at least partially arranged on a lower surface of the substrate, a first power hole passing through the device separation layer, a first insulating barrier covering inner side surfaces of the first power hole with a first thickness, a buried rail surrounded by the first insulating barrier and electrically connected to the power wiring line, a second power hole passing through the inter-gate insulating layer, a second insulating barrier covering inner side surfaces of the second power hole with a second thickness that is less than the first thickness, and a power via surrounded by the second insulating barrier, connecting the buried rail to the first conductive plug, and decreasing in horizontal width toward the buried rail, wherein the buried rail and the power wiring line decrease in horizontal width toward each other.

BRIEF DESCRIPTION OF THE DRAWINGS

Embodiments will be more clearly understood from the following detailed description taken in conjunction with the accompanying drawings in which.

DETAILED DESCRIPTION OF THE EMBODIMENTS

FIGS. 1A to 1D are plan layout diagrams illustrating an integrated circuit device according to embodiments.

Figure 1A:
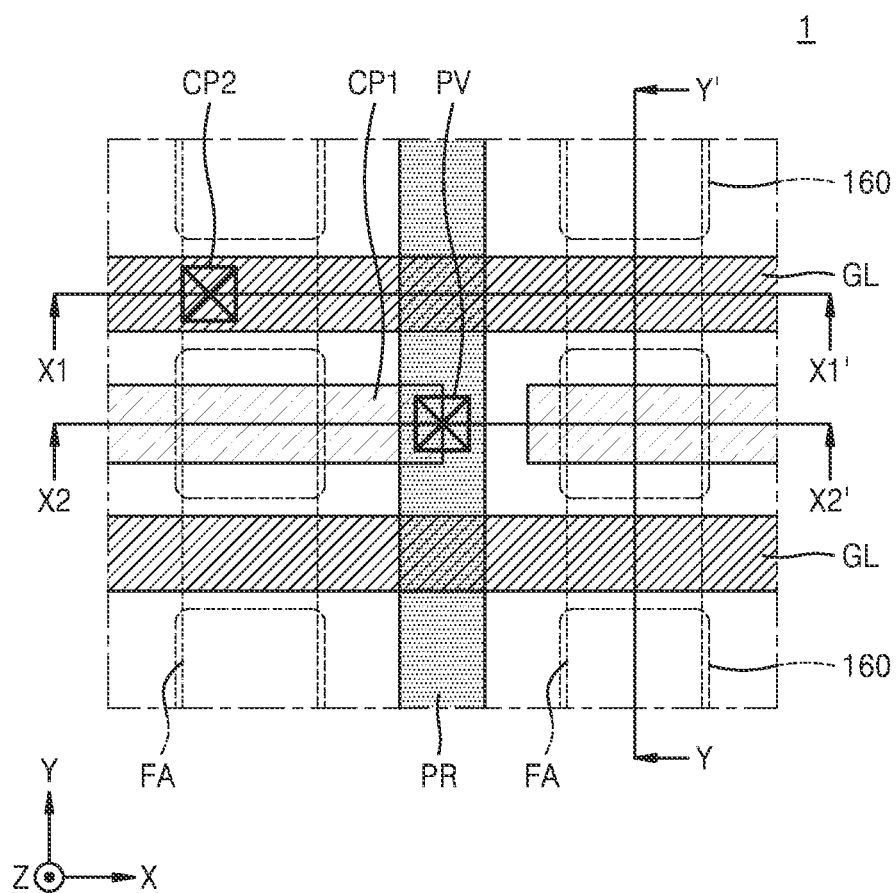
FIGS. 1A to 1D are plan layout diagrams illustrating an integrated circuit device according to embodiments.

Referring to FIG. 1A, an integrated circuit device 1 may include a fin field effect transistor (FinFET) device. The FinFET device may constitute a logic cell. The logic cell may be variously configured to include a plurality of circuit elements including a transistor, a register, and the like. The logic cell may constitute, for example, an AND, a NAND, an OR, a NOR, an exclusive OR (XOR), an exclusive NOR (XNOR), an inverter (INV), an adder (ADD), a buffer (BUF), a delay (DLY), a filter (FIL), a multiplexer (MXT/MXIT), an OR/AND/INVERTER (OAI), an AND/OR (AO), an AND/OR/INVERTER (AOI), a D flip-flop, a reset flip-flop, a master-slave flip-flop, a latch, and the like, and the logic cell may also constitute a standard cell that performs a desired logical function, such as a counter, a BUF, and the like.

The integrated circuit device 1 may include a plurality of fin-type active regions FA, a plurality of gate electrodes GL, a plurality of source/drain regions 160, a first conductive plug CP1, a second conductive plug CP2, and a power via PV.

The plurality of fin-type active regions FA may be arranged at a constant pitch in a first horizontal direction (X direction) and may extend parallel to each other in a second horizontal direction (Y direction). The plurality of gate electrodes GL may extend in the first horizontal direction (X direction) crossing the plurality of fin-type active regions FA. The plurality of gate electrodes GL may have the same width in the second horizontal direction (Y direction) and may be arranged at a constant pitch in the second horizontal direction (Y direction). A plurality of metal oxide semiconductor (MOS) transistors may be formed along the plurality of gate electrodes GL. Each of the plurality of MOS transistors may be a MOS transistor having a three-dimensional structure in which channels are formed on an upper surface and both sidewalls of each of the plurality of fin-type active regions FA.

In some embodiments, a portion of at least one of the plurality of gate electrodes GL may overlap a buried rail PR in a vertical direction (Z direction). For example, one gate electrode GL and the buried rail PR may cross each other, and the gate electrode GL and the buried rail PR may be insulated from each other. In some embodiments, the buried rail PR may extend in the second horizontal direction (Y direction).

The plurality of source/drain regions 160 may be formed on both sides of the gate electrode GL on the plurality of fin-type active regions FA. In some embodiments, at least some of the plurality of source/drain regions 160 may have an embedded silicon-germanium (SiGe) structure including a plurality of SiGe layers that are epitaxially grown. The plurality of SiGe layers may have different Ge contents. In some other embodiments, at least some of the plurality of source/drain regions 160 may include an epitaxially grown Si layer or an epitaxially grown silicon carbide (SiC) layer. The source/drain region 160 and the gate electrode GL may be insulated from each other.

The power via PV and the first conductive plug CP1 may be between each two of the plurality of gate electrodes GL. The power via PV and the gate electrode GL may be insulated from each other. The first conductive plug CP1 may contact at least a portion of an upper surface of the source/drain region 160 to be electrically connected to the source/drain region 160. The power via PV may electrically connect between the first conductive plug CP1 and the buried rail PR. The second conductive plug CP2 may be electrically connected to the gate electrode GL.

In some embodiments, the first conductive plug CP1 may have a line shape or a bar shape in a plan view and may have a vertical column shape extending in the vertical direction (Z direction). In some embodiments, the second conductive plug CP2 may have a circular shape, an elliptical shape, or a polygonal shape in a plan view and may have a vertical column shape extending in the vertical direction (Z direction). In some embodiments, the buried rail PR may have a line shape or a bar shape in a plan view. In some embodiments, the power via PV may have a circular shape, an elliptical shape, or a polygonal shape in a plan view and may have a vertical column shape extending in the vertical direction (Z direction).

Figure 1B:
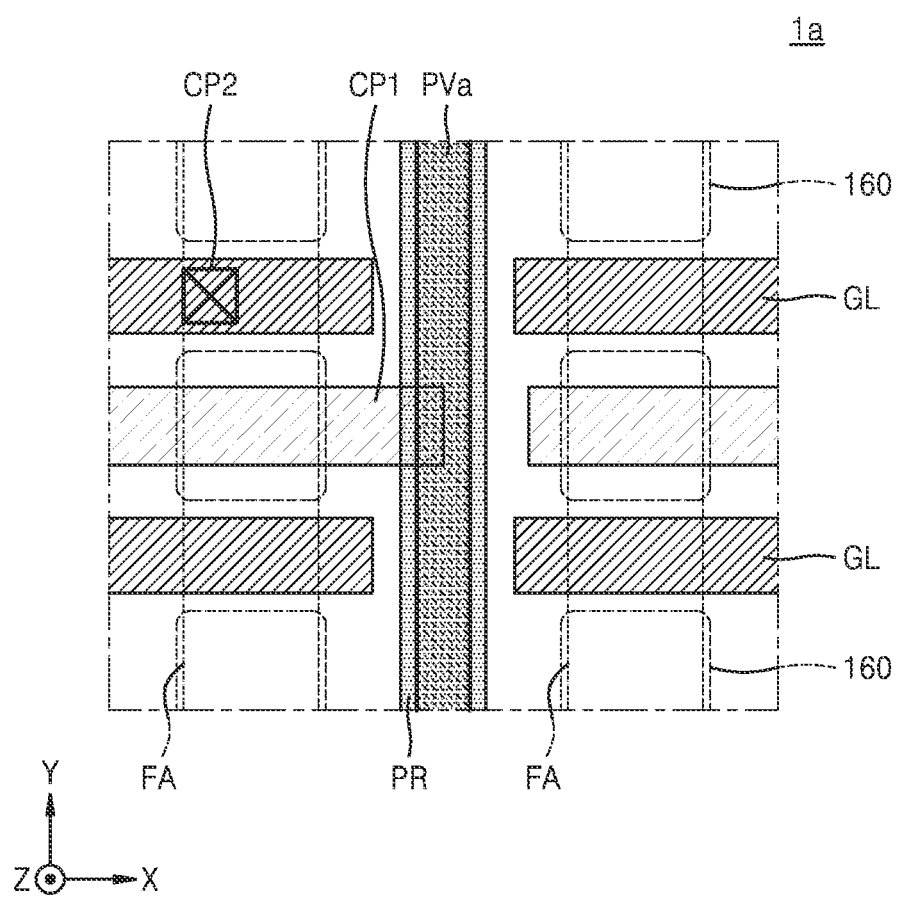

Referring to FIG. 1B, an integrated circuit device 1a may include the plurality of fin-type active regions FA, the plurality of gate electrodes GL, the plurality of source/drain regions 160, the first conductive plug CP1, the second conductive plug CP2, a power via PVa, and the buried rail PR.

The power via PVa may electrically connect between the first conductive plug CP1 and the buried rail PR. In some embodiments, the power via PVa may extend on the buried rail PR in an extension direction of the buried rail PR. For example, the power via PVa may extend in the second horizontal direction (Y direction). Although FIG. 1B shows that a horizontal width of the power via PVa is less than a horizontal width of the buried rail PR in the first horizontal direction (X direction), this is only for distinguishing between the power via PVa and the buried rail PR and embodiments are not limited thereto. For example, the horizontal width of the power via PVa may be the same as the horizontal width of the buried rail PR in the first horizontal direction (X direction). Alternatively, for example, the horizontal width of the power via PVa may be greater than the horizontal width of the buried rail PR in the first horizontal direction (X direction).

The power via PVa and the gate electrode GL may be insulated from each other. For example, the power via PVa and the gate electrode GL may not overlap each other in the vertical direction (Z direction). For example, one end of the gate electrode GL and a side surface of the power via PVa that face each other in a plan view may be apart from each other. The buried rail PR and the gate electrode GL may not overlap each other in the vertical direction (Z direction). For example, one end of the gate electrode GL and a side surface of the buried rail PR that face each other in a plan view may be apart from each other. That is, the gate electrode GL may have one end thereof cut adjacent to the buried rail PR in a plan view.

In some embodiments, each of the buried rail PR and the power via PVa may have a line shape or a bar shape in a plan view.

Figure 1C:
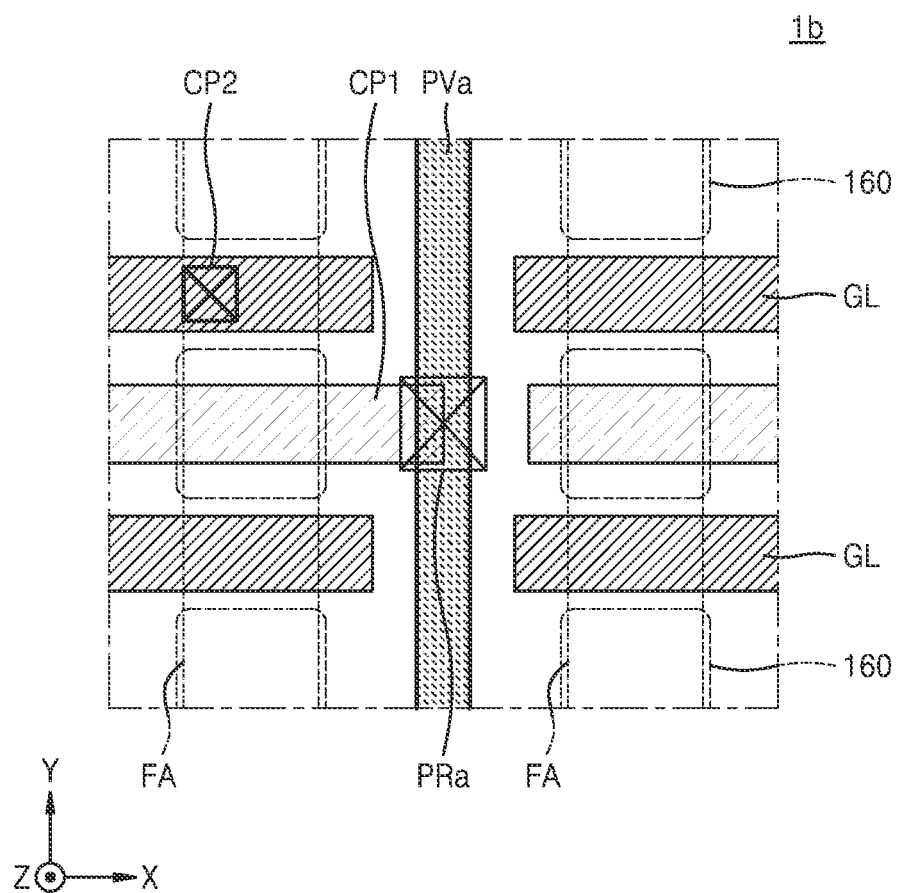

Referring to FIG. 1C, an integrated circuit device 1b may include the plurality of fin-type active regions FA, the plurality of gate electrodes GL, the plurality of source/drain regions 160, the first conductive plug CP1, the second conductive plug CP2, the power via PVa, and a buried rail PRa.

The power via PVa may electrically connect between the first conductive plug CP1 and the buried rail PRa. For example, the power via PVa may extend in the second horizontal direction (Y direction).

The power via PVa and the gate electrode GL may be insulated from each other. For example, the power via PVa and the gate electrode GL may not overlap each other in the vertical direction (Z direction). For example, one end of the gate electrode GL and a side surface of the power via PVa that face each other in a plan view may be apart from each other.

In some embodiments, the buried rail PRa may have a circular shape, an elliptical shape, or a polygonal shape in a plan view and may have a vertical column shape extending in the vertical direction (Z direction). In some embodiments, the power via PVa may have a line shape or a bar shape in a plan view.

Figure 1D:
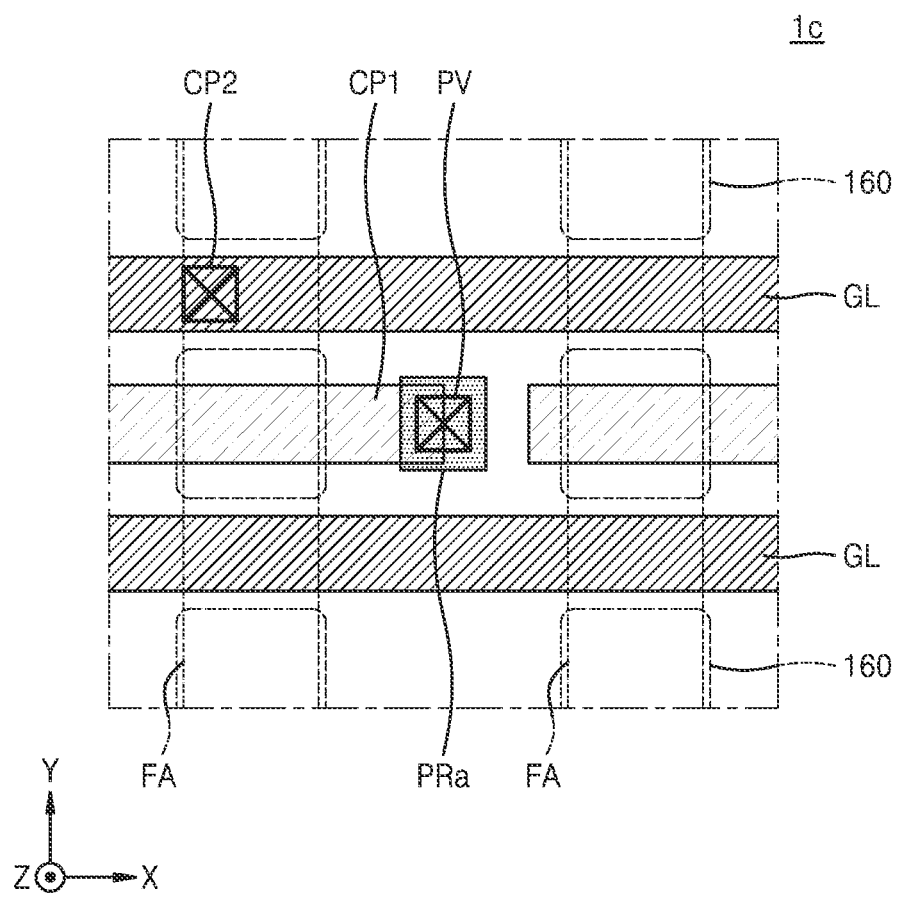

Referring to FIG. 1D, an integrated circuit device 1c may include the plurality of fin-type active regions FA, the plurality of gate electrodes GL, the plurality of source/drain regions 160, the first conductive plug CP1, the second conductive plug CP2, the power via PV, and the buried rail PRa.

The power via PV may electrically connect between the first conductive plug CP1 and the buried rail PRa. The power via PV and the gate electrode GL may be insulated from each other.

In some embodiments, each of the buried rail PRa and the power via PV may have a circular shape, an elliptical shape, or a polygonal shape in a plan view, and may have a vertical column shape extending in the vertical direction (Z direction).

FIGS. 2 to 17 are cross-sectional views illustrating a method of manufacturing an integrated circuit device, according to embodiments. Specifically, FIGS. 2, 3, 4, 5, 6, 7, 8, 9A, 11A, 12A, 13A, 14A, and 15A are cross-sectional views taken along a position corresponding to a line X1-X1' of FIG. 1A, FIGS. 10A, 11B, 12B, 13B, 14B, 15B, 16, and 17 are cross-sectional views taken along a position corresponding to a line X2-X2' of FIG. 1A, and FIGS. 9B, 10B, 11C, and 15C are cross-sectional views taken along a position corresponding to a line Y-Y' of FIG. 1A.

Figure 2:
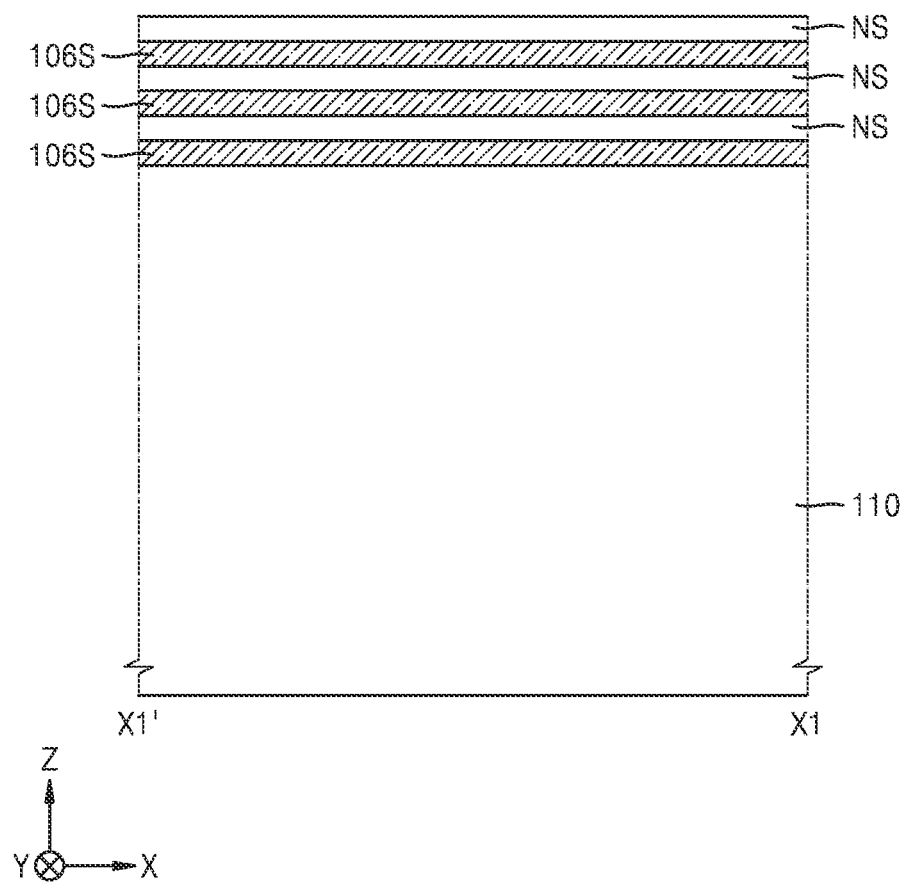
FIGS. 2-8, 9A, 9B, 10A, 10B, 11A-11C, 12A, 12B, 13A, 13B, 14A, 14B, 15A-15C, 16, and 17 are cross-sectional views illustrating a method of manufacturing an integrated circuit device, according to embodiments.

Referring to FIG. 2, a plurality of sacrificial semiconductor layers 106S and a plurality of nanosheet semiconductor layers NS are alternately stacked on a substrate 110 one-by-one. The plurality of sacrificial semiconductor layers 106S and the plurality of nanosheet semiconductor layers NS may include different semiconductor materials. In some embodiments, the plurality of nanosheet semiconductor layers NS may include a single material. In some embodiments, the plurality of nanosheet semiconductor layers NS may include the same material as that of the substrate 110. In some embodiments, the plurality of sacrificial semiconductor layers 106S may include SiGe and the plurality of nanosheet semiconductor layers NS may include Si, but embodiments are not limited thereto.

The plurality of sacrificial semiconductor layers 106S may all have the same thickness, but embodiments are not limited thereto. In some embodiments, a thickness of the sacrificial semiconductor layer 106S closest to the substrate 110 among the plurality of sacrificial semiconductor layers 106S may be greater than those of the other sacrificial semiconductor layers 106S.

The substrate 110 may include a semiconductor, such as Si or Ge, or a compound semiconductor, such as SiGe, SiC, gallium arsenide (GaAs), indium arsenide (InAs), or indium phosphide (InP). In some embodiments, the substrate 110 may include at least one of a group III-V material and a group IV material. The group III-V material may be a binary, ternary, or quaternary compound including at least one group III element and at least one group V element. In some embodiments, when an n-channel MOS (NMOS) transistor is formed on a portion of the substrate 110, the portion of the substrate 110 may include one of the group III-V materials described above. In some other embodiments, when a p-channel MOS (PMOS) transistor is formed on a portion of the substrate 110, the portion of the substrate 110 may include Ge. In another example, the substrate 110 may have a semiconductor-on-insulator (SOI) structure. The substrate 110 may include a conductive region, for example, an impurity-doped well or an impurity-doped structure.

Figure 3:
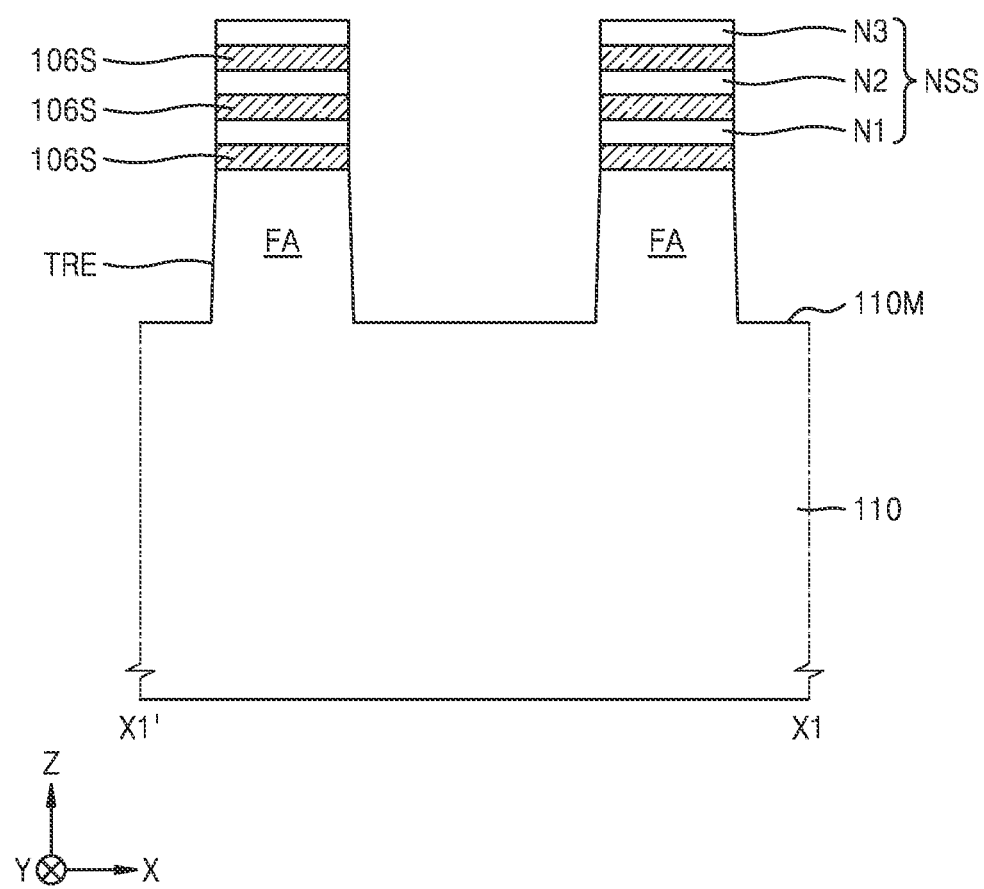

Referring to FIGS. 2 and 3 together, a plurality of trenches TRE are formed by etching portions of the stacked structure of the plurality of sacrificial semiconductor layers 106S and the plurality of nanosheet semiconductor layers NS and the substrate 110. As a result, the plurality of fin-type active regions FA that are defined by the trench TRE may be formed. The plurality of fin-type active regions FA may extend parallel to each other in the second horizontal direction (Y direction). The plurality of fin-type active regions FA may protrude upward from a main surface 110M of the substrate 110 in the vertical direction (Z direction). At least some of the plurality of fin-type active regions FA may be arranged at the same pitch in the first horizontal direction (X direction).

The plurality of sacrificial semiconductor layers 106S and a stacked structure NSS of a plurality of nanosheets N1, N2, and N3 may be arranged on the plurality of fin-type active regions FA. The stacked structure NSS of the plurality of nanosheets N1, N2, and N3 may be formed by removing portions of the plurality of nanosheet semiconductor layers NS by etching.

Figure 4:
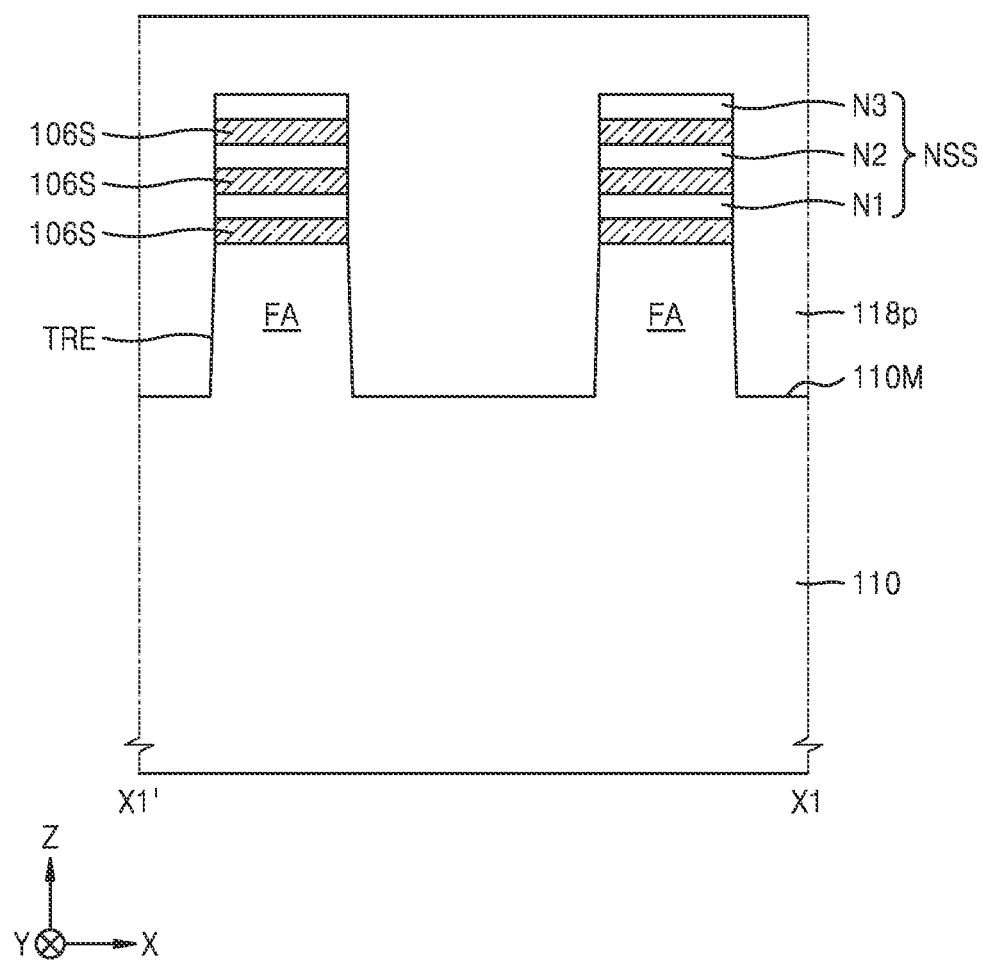

Referring to FIG. 4, a preliminary device separation layer 118p filling the plurality of trenches TRE is formed. The preliminary device separation layer 118p may be formed to fill the trench TRE and to cover sidewalls of the plurality of fin-type active regions FA and sidewalls and an upper surface of the stacked structure NSS of the plurality of nanosheets N1, N2, and N3. In some embodiments, an upper surface of the preliminary device separation layer 118p may be at a higher level than an upper end of the stacked structure NSS of the plurality of nanosheets N1, N2, and N3. For example, the preliminary device separation layer 118p may include silicon oxide.

Figure 5:
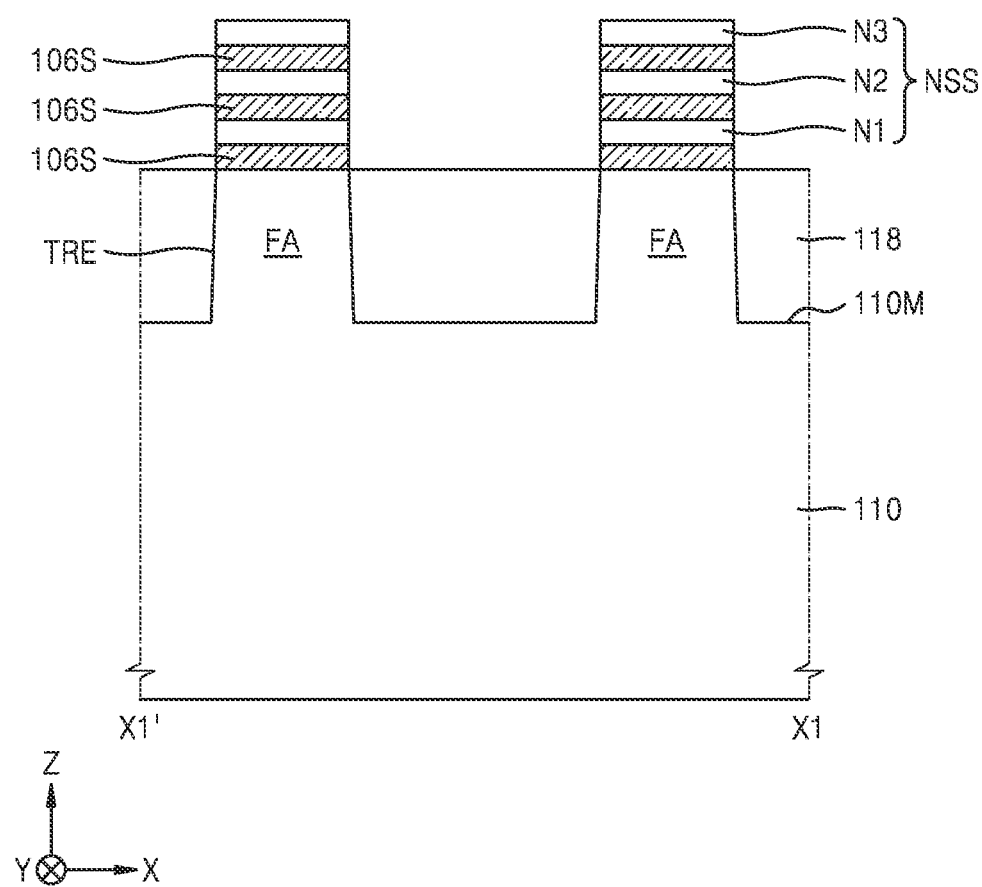

Referring to FIGS. 4 and 5 together, a device separation layer 118 is formed by performing a recess process for removing a partial thickness of the preliminary device separation layer 118p from an upper portion thereof. To perform the recess process, dry etching, wet etching, or a combination of dry etching and wet etching may be used.

The device separation layer 118 may fill the trench TRE. The device separation layer 118 may define the plurality of fin-type active regions FA. The recess process may be performed such that an upper surface of the device separation layer 118 is at the same or substantially similar level as an upper surface of the fin-type active region FA. As a result, sidewalls of the stacked structure NSS of the plurality of nanosheets N1, N2, and N3 and the plurality of sacrificial semiconductor layers 106S on the fin-type active region FA may be exposed.

Figure 6:
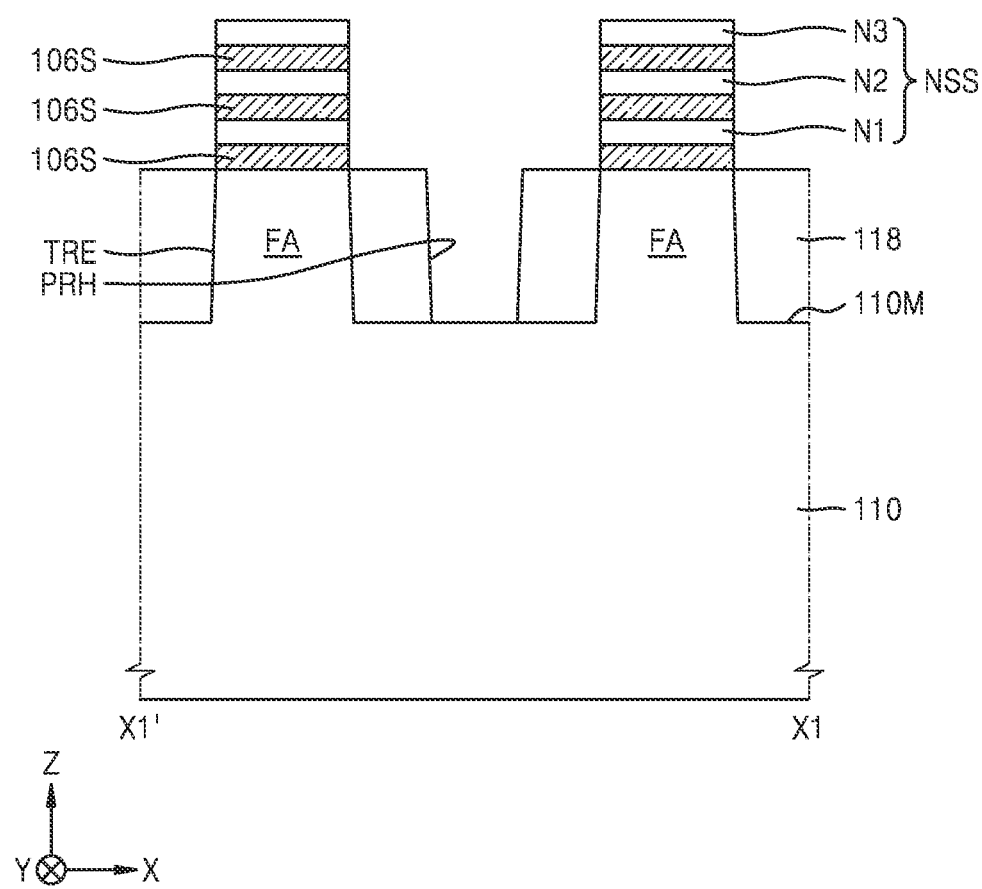

Referring to FIG. 6, a first power hole PRH may be formed by removing a portion of the device separation layer 118. The first power hole PRH may be formed by removing a portion of the device separation layer 118 from the upper surface of the device separation layer 118. The first power hole PRH may be formed to pass through the device separation layer 118 such that the substrate 110 is exposed on a lower surface of the first power hole PRH. In some embodiments, the lower surface of the first power hole PRH and the main surface 110M of the substrate 110 may be at the same vertical level, but embodiments are not limited thereto. In some other embodiments, the first power hole PRH may be formed to extend into the substrate 110 such that the lower surface of the first power hole PRH is at a lower vertical level than the main surface 110M of the substrate 110.

In some embodiments, the first power hole PRH may be formed to extend in the second horizontal direction (Y direction) to correspond to the buried rail PR shown in FIG. 1A. The first power hole PRH may be referred to as a buried rail hole.

The first power hole PRH may be formed to have a tapered shape in which a horizontal width thereof decreases from an upper side thereof toward a lower side thereof in the vertical direction (Z direction). The first power hole PRH may be formed to decrease in horizontal width away from the upper surface of the device separation layer 118.

Figure 7:
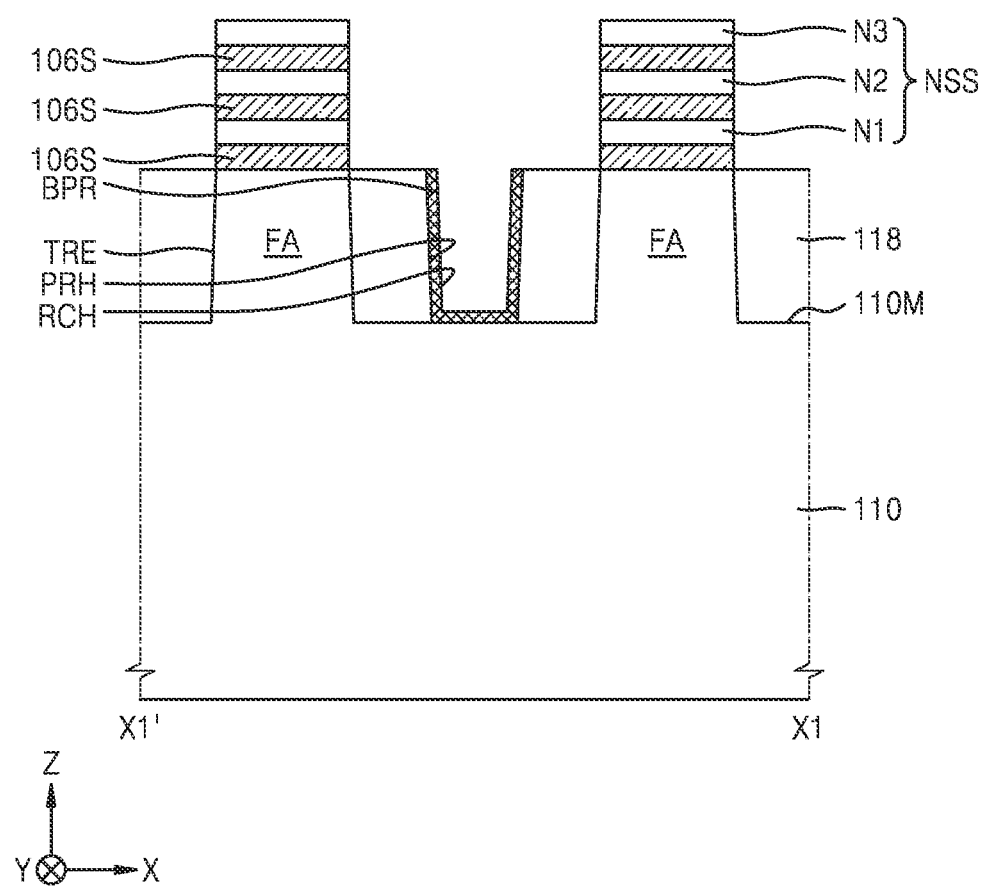

Referring to FIG. 7, a first insulating barrier BPR covering inner surfaces of the first power hole PRH is formed. The first insulating barrier BPR may define a limited space RCH in the first power hole PRH. The first insulating barrier BPR may cover inner side surfaces and the lower surface of the first power hole PRH, but may conformally cover the inner surfaces of the first power hole PRH so as not to fill the first power hole PRH. For example, the first insulating barrier BPR may include nitride. In some embodiments, the first insulating barrier BPR may include silicon nitride.

Figure 8:
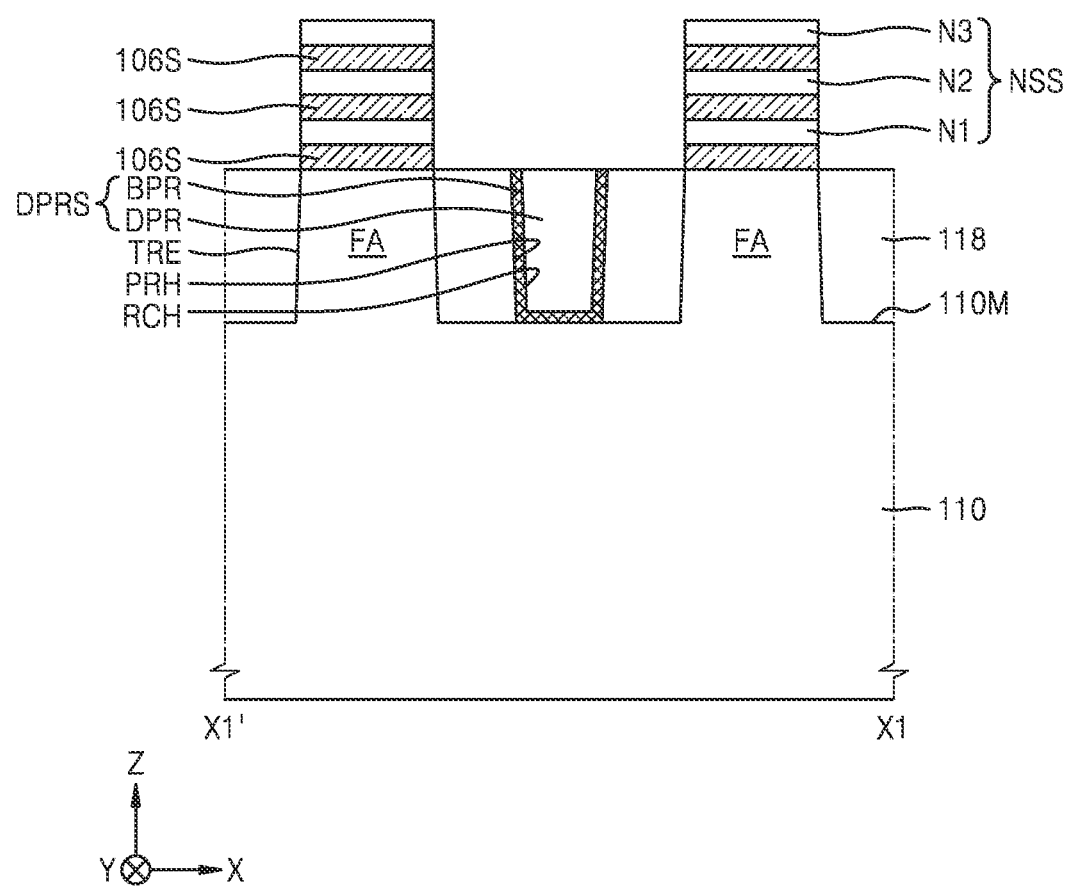

Referring to FIG. 8, a dummy buried rail DPR filling the first power hole PRH is formed. The dummy buried rail DPR may cover the first insulating barrier BPR and fill the limited space RCH. The first insulating barrier BPR and the dummy buried rail DPR may entirely fill the first power hole PRH. The first insulating barrier BPR and the dummy buried rail DPR may be collectively referred to as a dummy rail structure DPRS.

For example, the dummy buried rail DPR may include silicon oxide. In some embodiments, an upper surface of the dummy buried rail DPR and the upper surface of the device separation layer 118 may be at the same vertical level to form a coplanar surface.

The dummy buried rail DPR may be formed to have a tapered shape in which a horizontal width thereof decreases from an upper side thereof toward a lower side thereof in the vertical direction (Z direction). The dummy buried rail DPR may be formed to decrease in horizontal width away from the upper surface of the device separation layer 118.

Figure 9A:
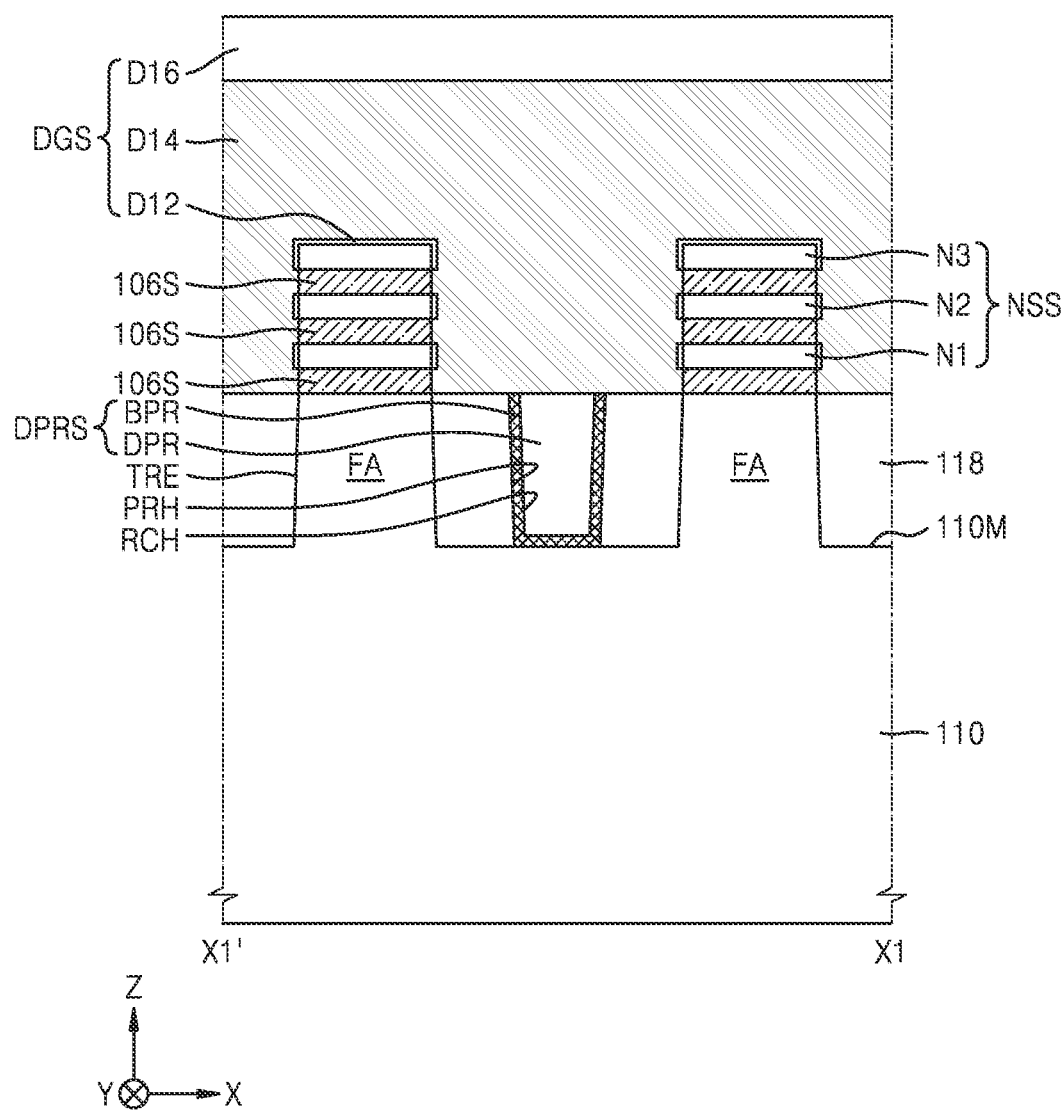
Figure 9B:
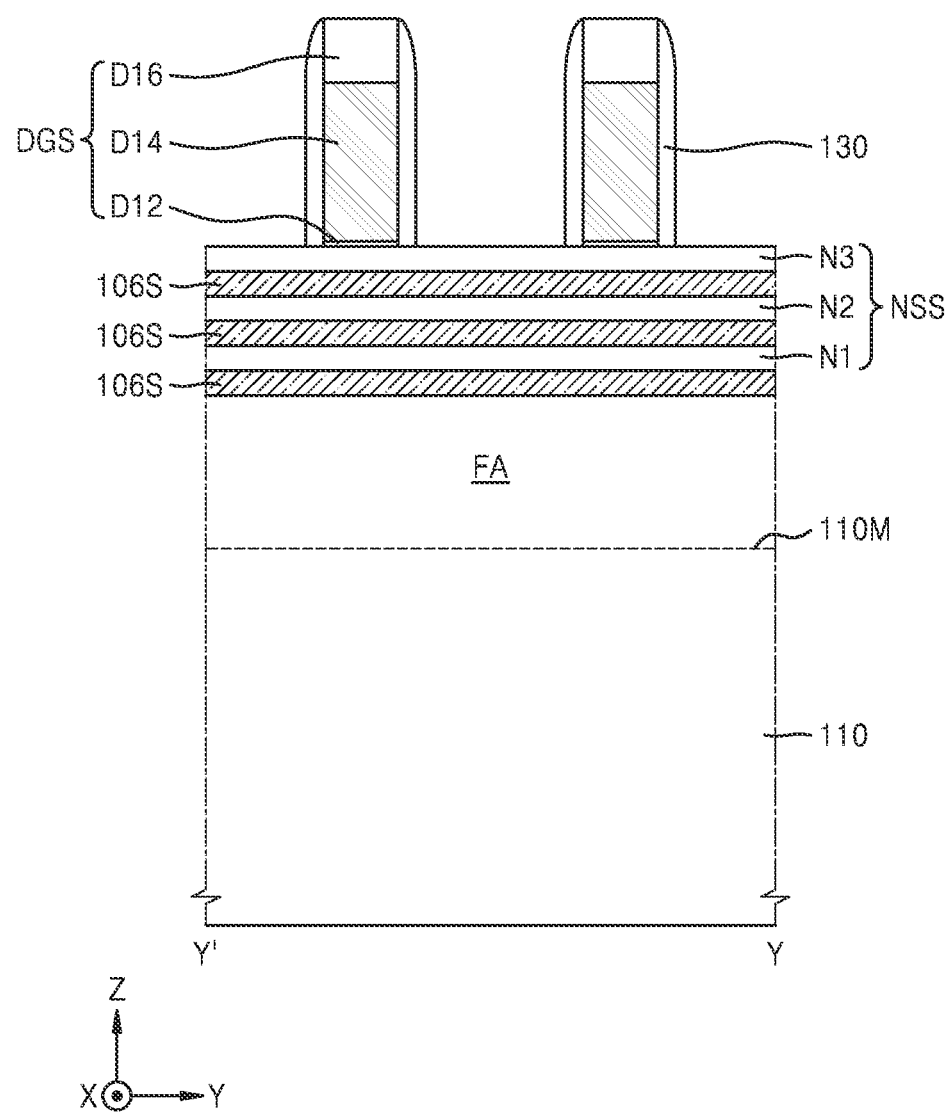

Referring to FIGS. 9A and 9B together, a plurality of dummy gate structures DGS extending to cross at least portions of the plurality of fin-type active regions FA are formed on the plurality of fin-type active regions FA on which the stacked structure NSS of the plurality of nanosheets N1, N2, and N3 and the plurality of sacrificial semiconductor layers 106S are formed. The plurality of dummy gate structures DGS may extend parallel to each other in the first horizontal direction (X direction).

The dummy gate structure DGS may have a structure in which an oxide layer D12, a dummy gate layer D14, and a capping layer D16 are sequentially stacked. In some embodiments, after forming the oxide layer D12, the dummy gate layer D14, and the capping layer D16 sequentially to cover exposed surfaces of the stacked structure NSS of the plurality of nanosheets N1, N2, and N3 and the plurality of sacrificial semiconductor layers 106S covering the plurality of fin-type active regions FA, exposed surfaces of the plurality of fin-type active regions FA, and the upper surface of the device separation layer 118, respectively, the oxide layer D12, the dummy gate layer D14, and the capping layer D16 may be patterned such that the oxide layer D12, the dummy gate layer D14, and the capping layer D16 remain only in necessary portions, thereby forming the dummy gate structure DGS.

In some embodiments, the dummy gate layer D14 may include polysilicon and the capping layer D16 may include silicon nitride, but embodiments are not limited thereto.

Thereafter, after forming a spacer layer on the semiconductor substrate 110 on which the dummy gate structure DGS is formed, the spacer layer may be etched back to form a pair of gate spacers 130 covering both sidewalls of the dummy gate structure DGS. The gate spacer 130 may include, for example, silicon nitride.

Figure 10A:
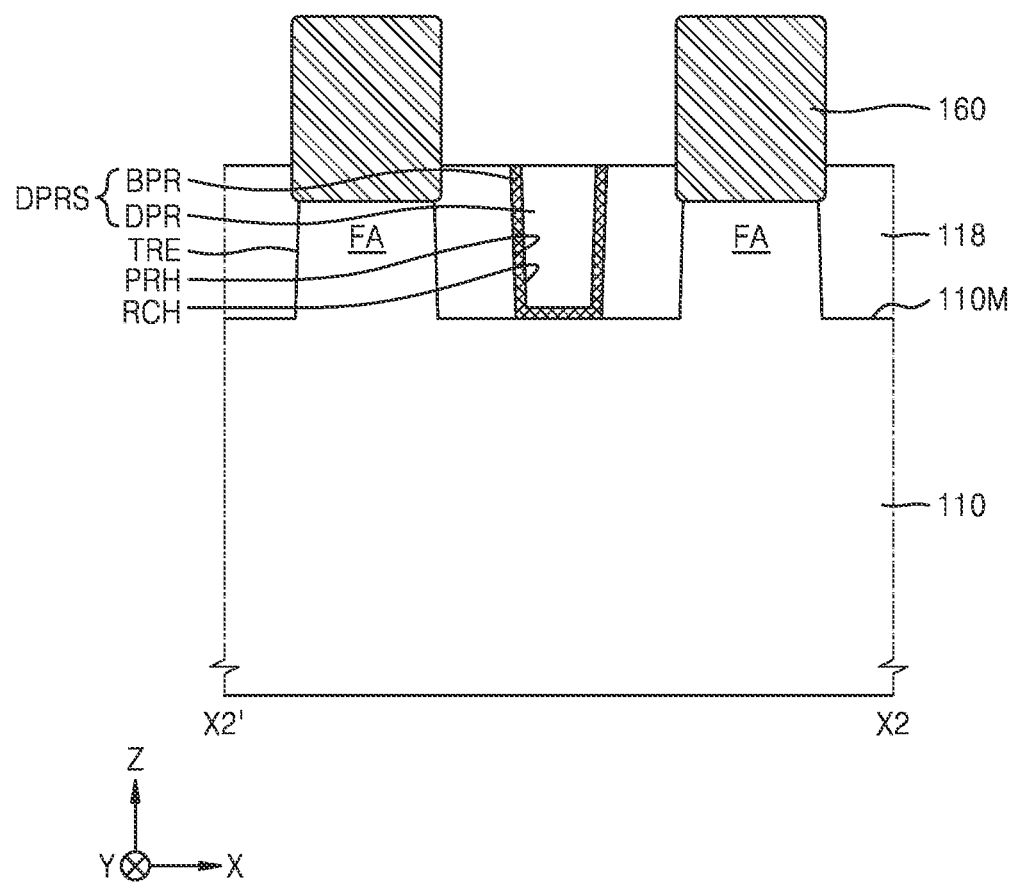
Figure 10B:
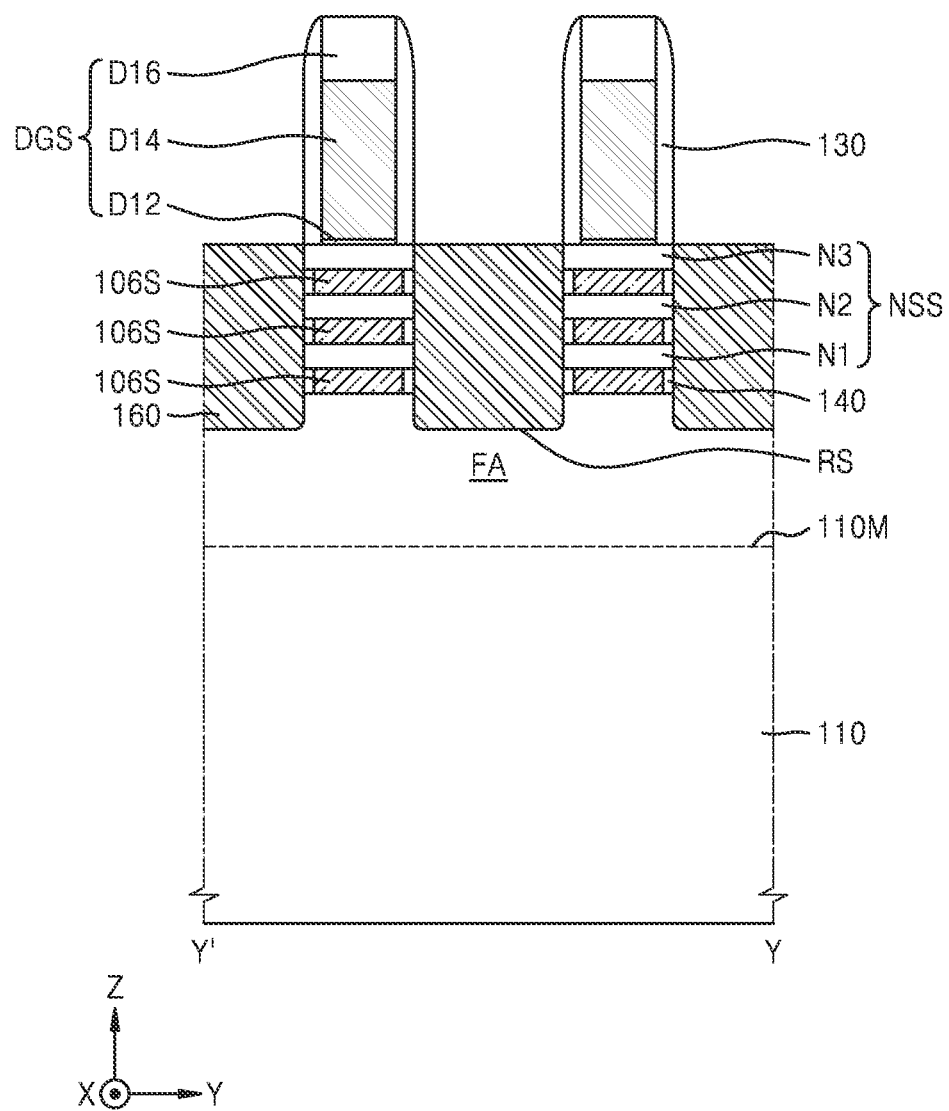
Figure 11A:
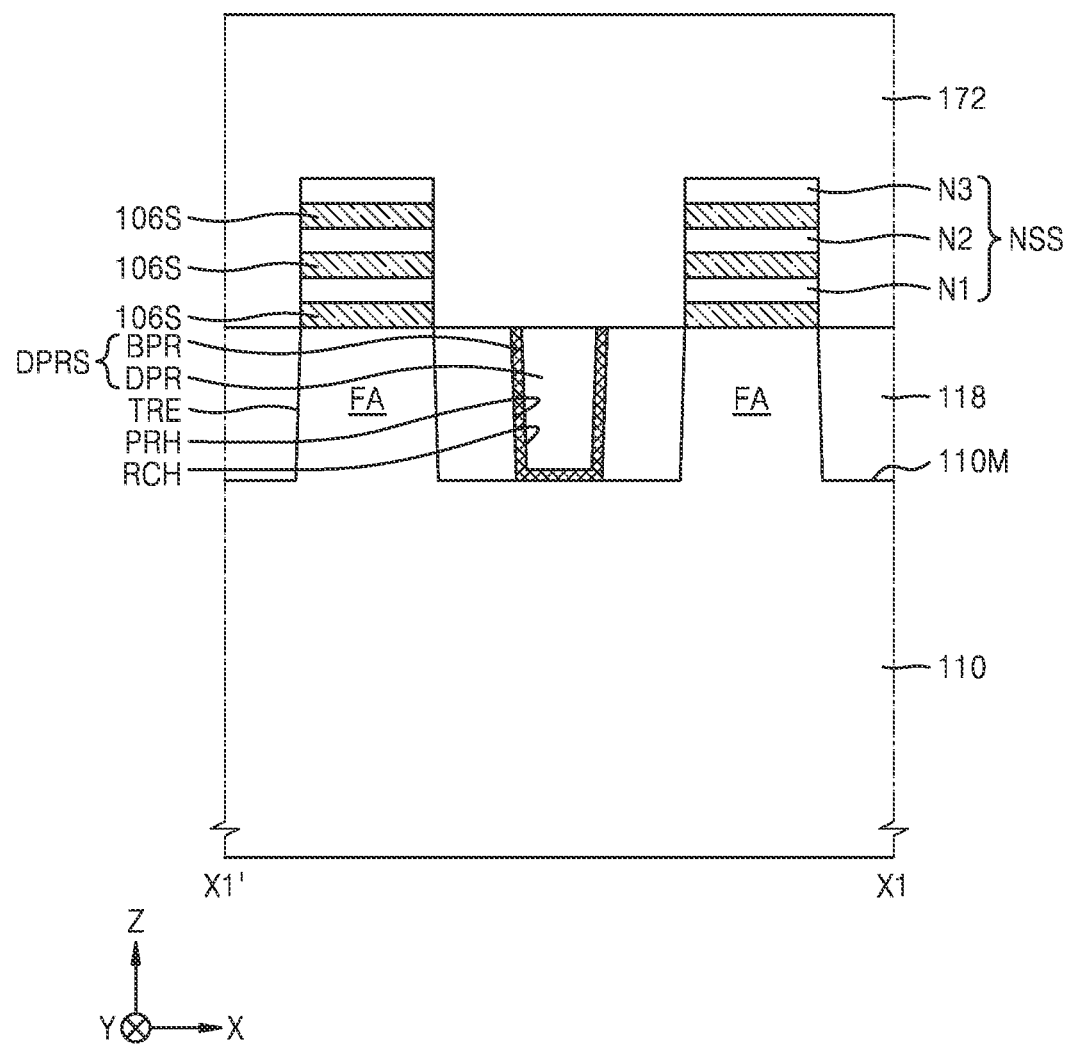
Figure 11B:
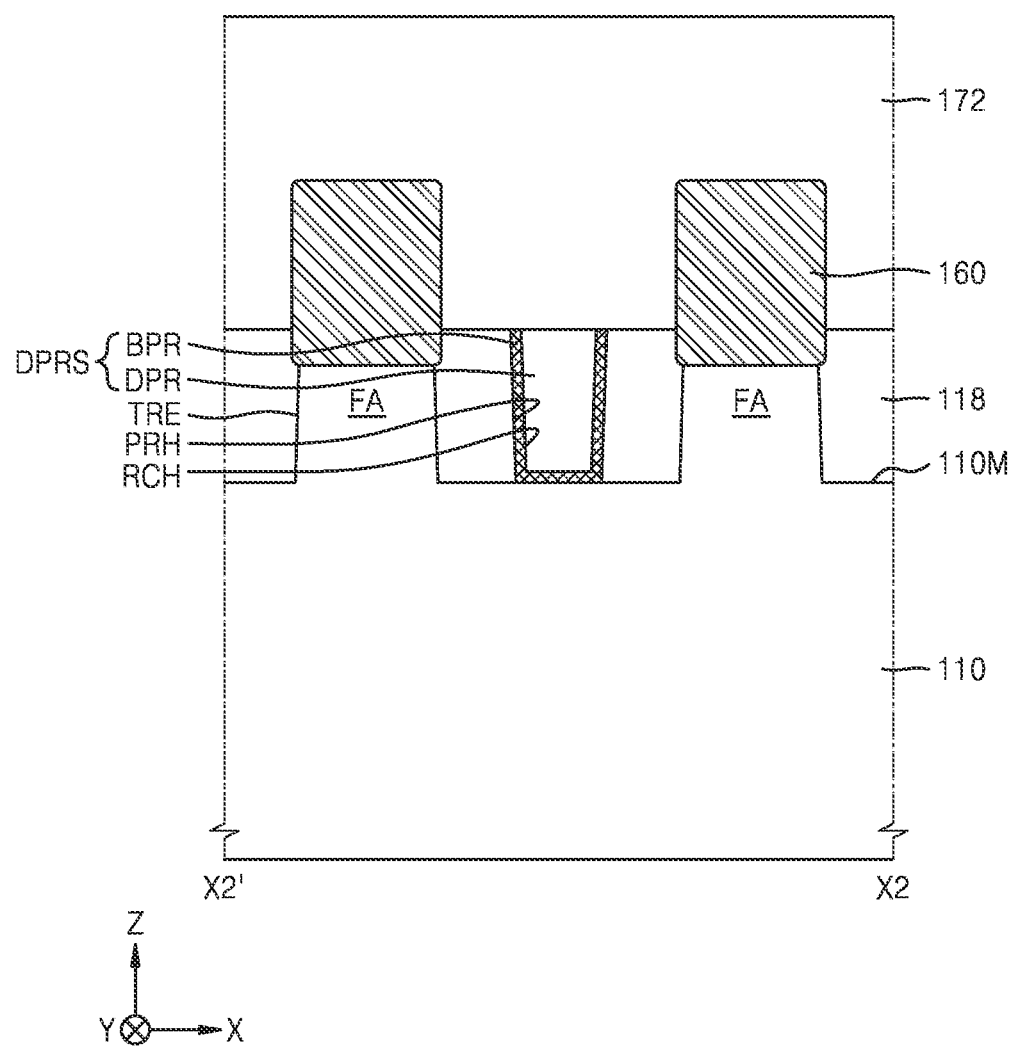
Figure 11C:
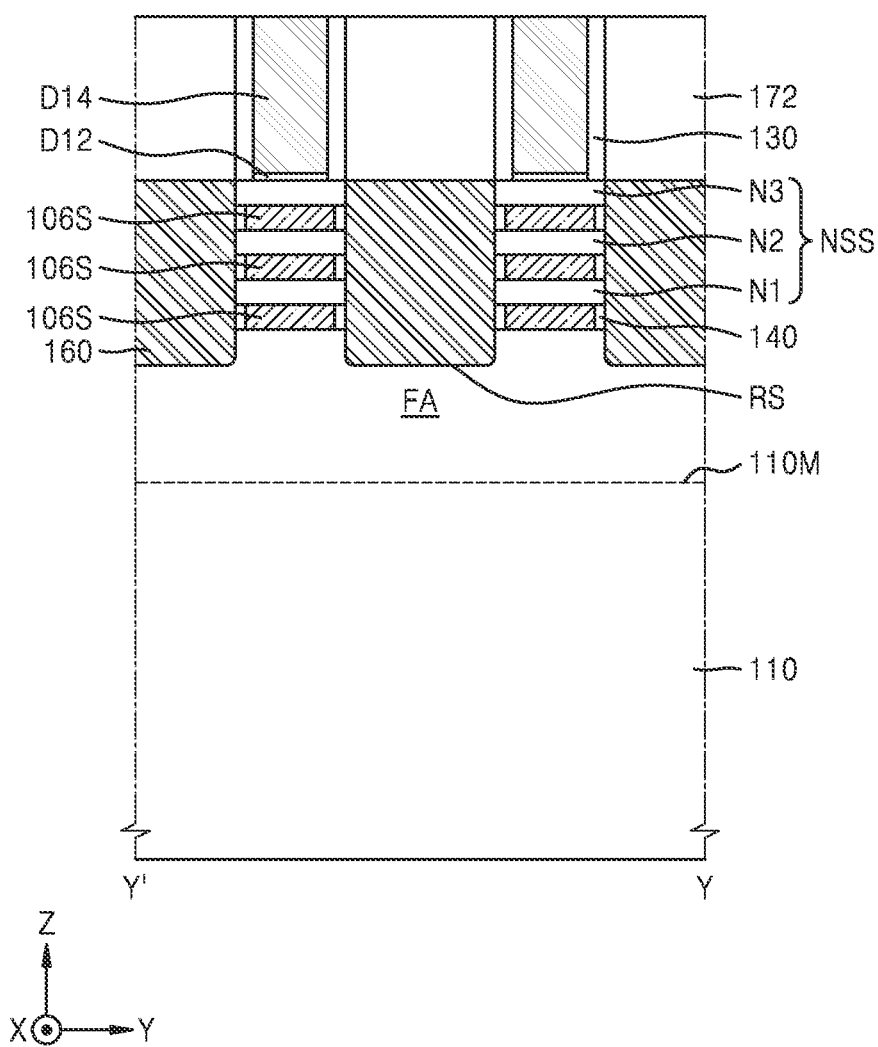

Referring to FIGS. 10A and 10B together, a recess region RS is formed by removing portions of the stacked structure NSS of the plurality of nanosheets N1, N2, and N3 and the plurality of sacrificial semiconductor layers 106S by etching using the dummy gate structure DGS and the gate spacer 130 as etch masks. The fin-type active region FA may be exposed on a lower surface of the recess region RS. In some embodiments, in the process of etching portions of the stacked structure NSS of the plurality of nanosheets N1, N2, and N3 and the plurality of sacrificial semiconductor layers 106S, an upper portion of the fin-type active region FA may also be removed.

Thereafter, after forming a removal space by removing portions of the plurality of sacrificial semiconductor layers 106S exposed on both sides of the stacked structure NSS of the plurality of nanosheets N1, N2, and N3 by using an isotropic etching process, an insulating spacer 140 filling the removal space formed between each two of the nanosheets N1, N2, and N3 is formed. The insulating spacer 140 may include, for example, silicon nitride. In some embodiments, the insulating spacer 140 may include a plurality of insulating layers that are stacked.

After forming the insulating spacer 140, the plurality of source/drain regions 160 are formed by epitaxially growing a semiconductor material from both exposed sidewalls of the plurality of nanosheets N1, N2, and N3 and an exposed surface of the fin-type active region FA.

In some embodiments, some of the plurality of source/drain regions 160 and some others of the plurality of source/drain regions 160 may include different materials, and some of the plurality of source/drain regions 160 and some others of the plurality of source/drain regions 160 including different materials may be formed by performing separate epitaxial growth processes. For example, some of the plurality of source/drain regions 160 may include Ge. In some embodiments, some of the plurality of source/drain regions 160 may have a multi-layered structure of a semiconductor material including Si and a semiconductor material including Ge.

For example, some others of the plurality of source/drain regions 160 may include Si but not Ge. In some embodiments, some others of the plurality of source/drain regions 160 may have a multi-layered structure of a semiconductor material including Si and a semiconductor material, such as Si, or a compound semiconductor material, such as SiC.

Referring to FIGS. 10A, 10B, 11A, 11B, and 11C together, after forming an inter-gate insulating layer 172 on the plurality of dummy gate structures DGS and the plurality of source/drain regions 160, a planarization process of removing an upper portion of the inter-gate insulating layer 172, the capping layer D16, and a portion of the gate spacer 130 surrounding the capping layer D16 is performed, so that an upper surface of the inter-gate insulating layer 172 is at approximately the same level as an upper surface of the dummy gate layer D14. In some embodiments, the inter-gate insulating layer 172 may include silicon oxide.

Figure 12A:
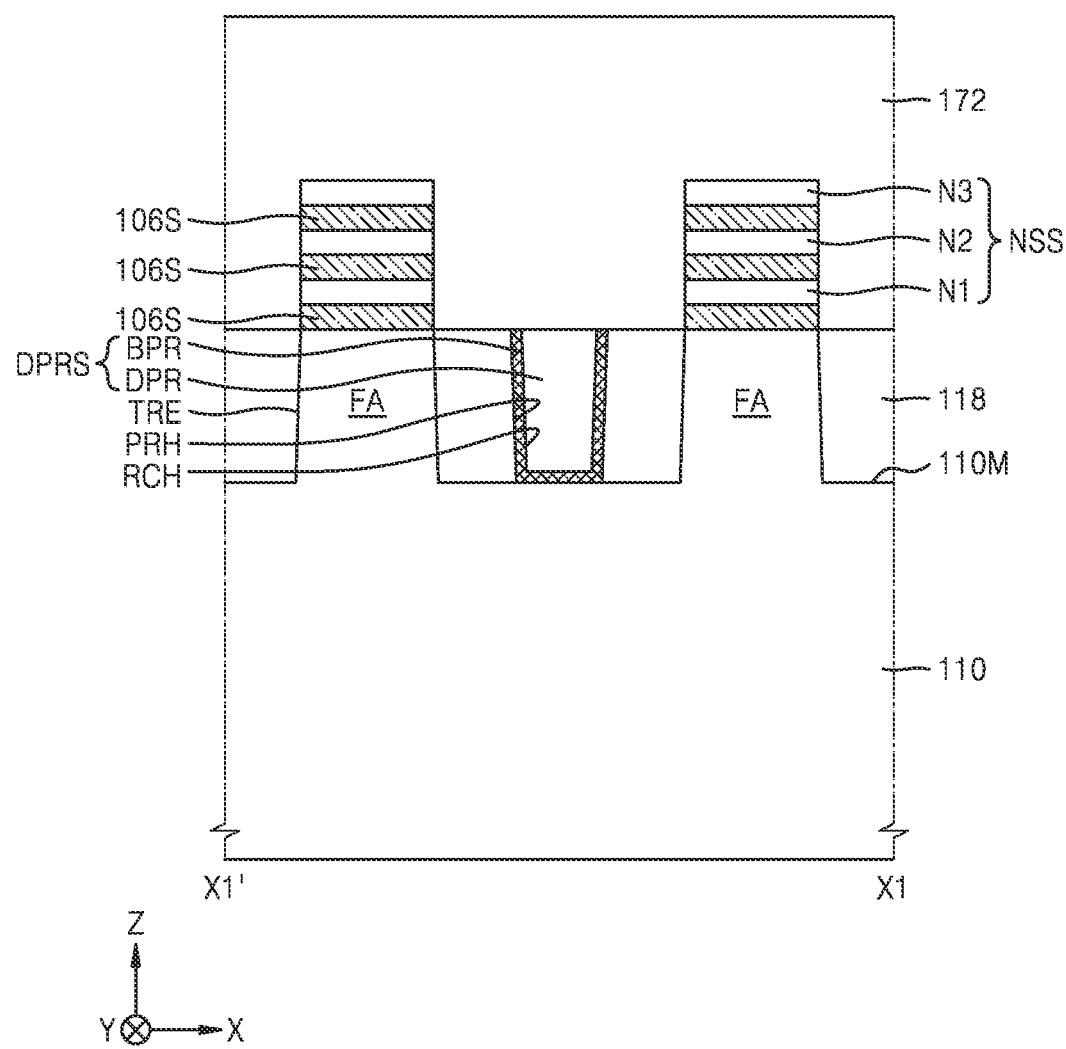
Figure 12B:
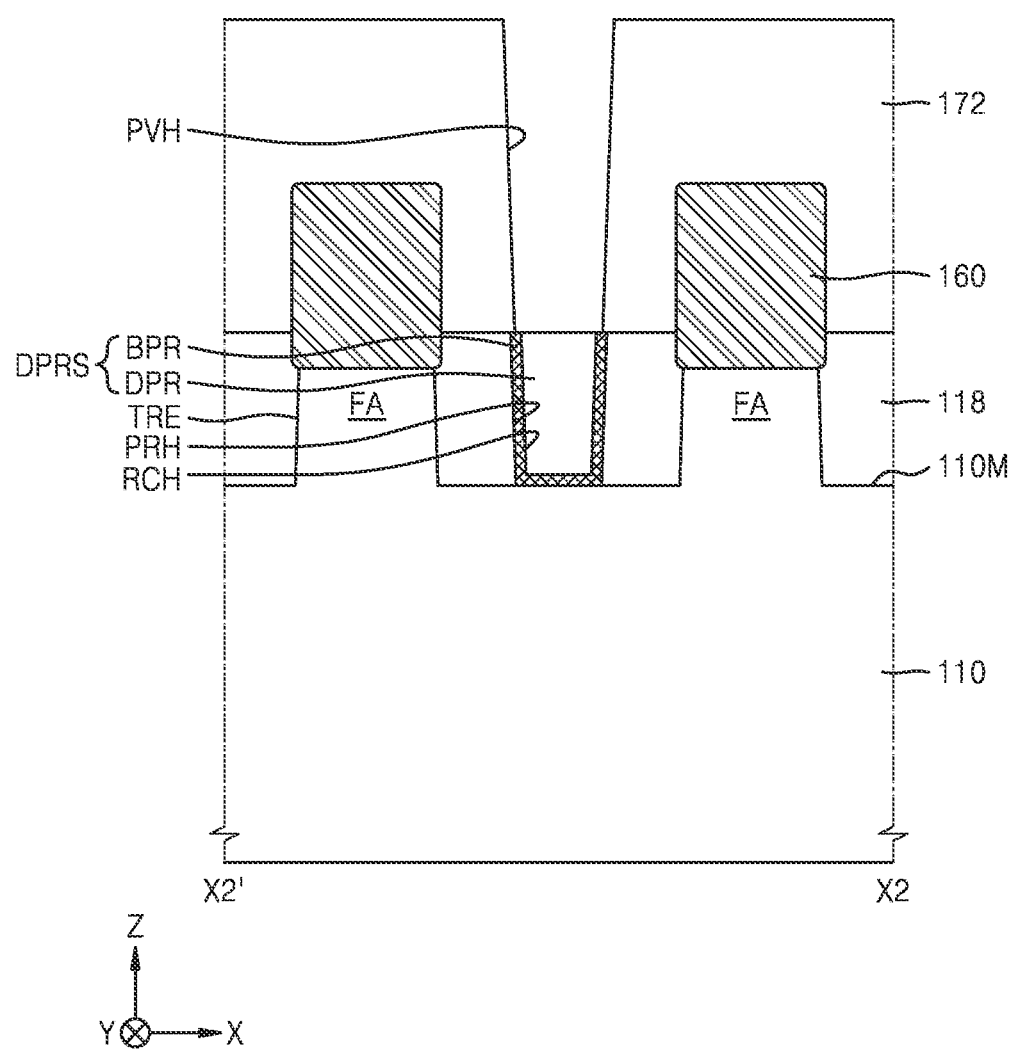

Referring to FIGS. 12A and 12B together, a second power hole PVH may be formed by removing a portion of the inter-gate insulating layer 172. The second power hole PVH may be formed to pass through the inter-gate insulating layer 172 such that the dummy rail structure DPRS is exposed on a lower surface of the second power hole PVH. In some embodiments, the second power hole PVH may be formed to extend in the vertical direction (Z direction) to correspond to the power via PV shown in FIG. 1. The second power hole PVH may be referred to as a power via hole.

In some embodiments, the lower surface of the second power hole PVH may be at the same vertical level as an upper end of the first insulating barrier BPR. In some other embodiments, in the process of forming the second power hole PVH, an upper portion of the dummy buried rail DPR may be removed such that the lower surface of the second power hole PVH is at a lower vertical level than the upper end of the first insulating barrier BPR. For example, in the process of forming the second power hole PVH, an upper portion of the dummy buried rail DPR may be removed such that an upper end of the dummy buried rail DPR is at a lower vertical level than the upper end of the first insulating barrier BPR.

The second power hole PVH may be formed to have a tapered shape in which a horizontal width thereof decreases from an upper side thereof toward a lower side thereof in the vertical direction (Z direction). The second power hole PVH may be formed to decrease in horizontal width toward the main surface 110M of the substrate 110 or the upper surface of the device separation layer 118.

Figure 13A:
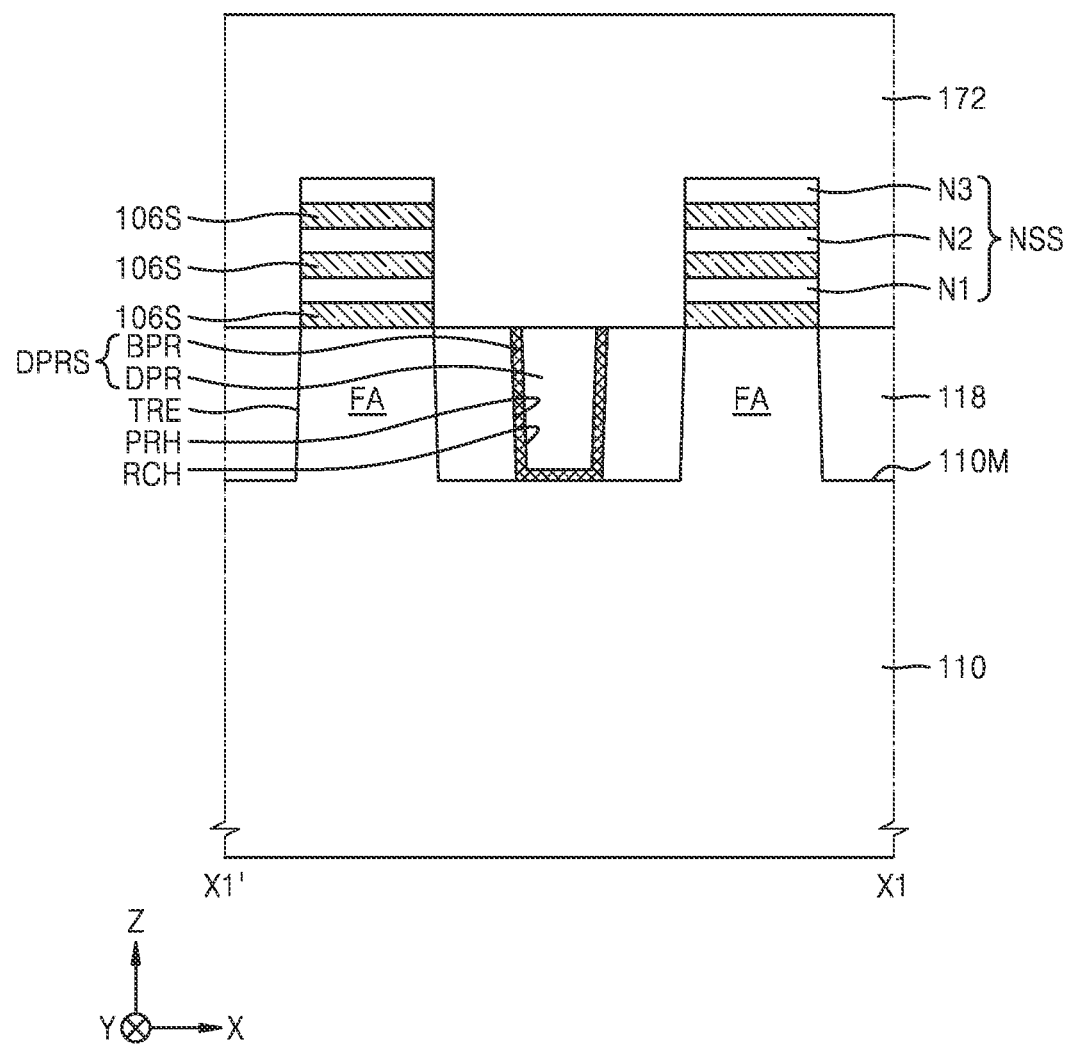
Figure 13B:
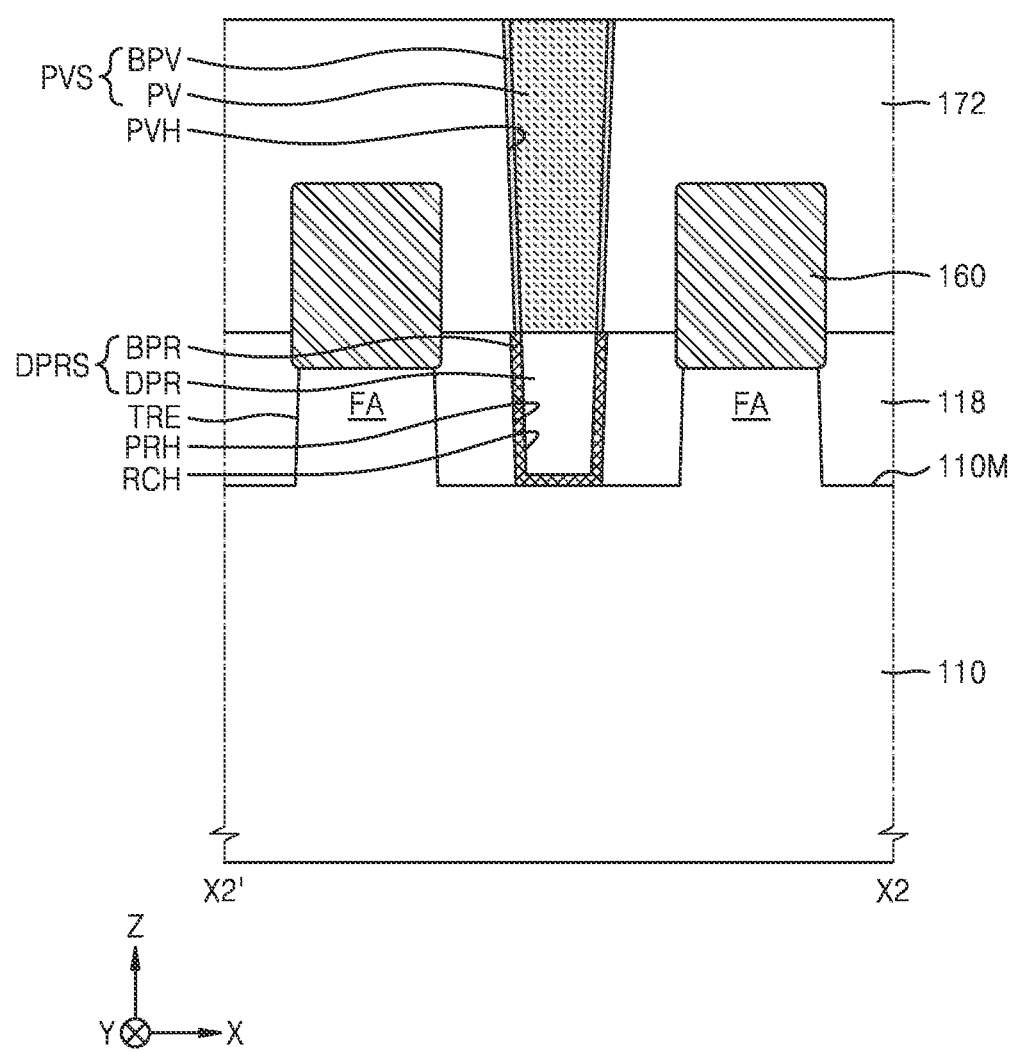
Figure 14A:
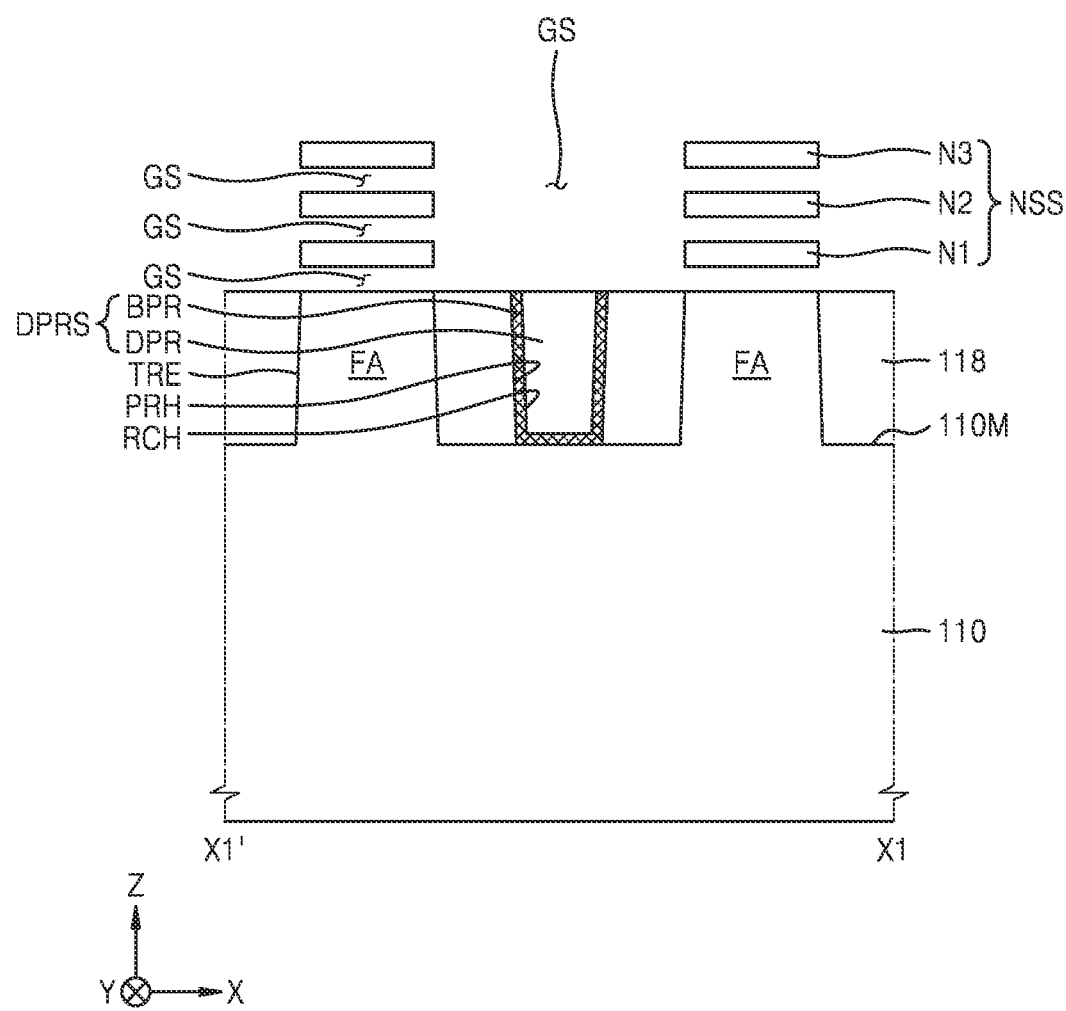
Figure 14B:
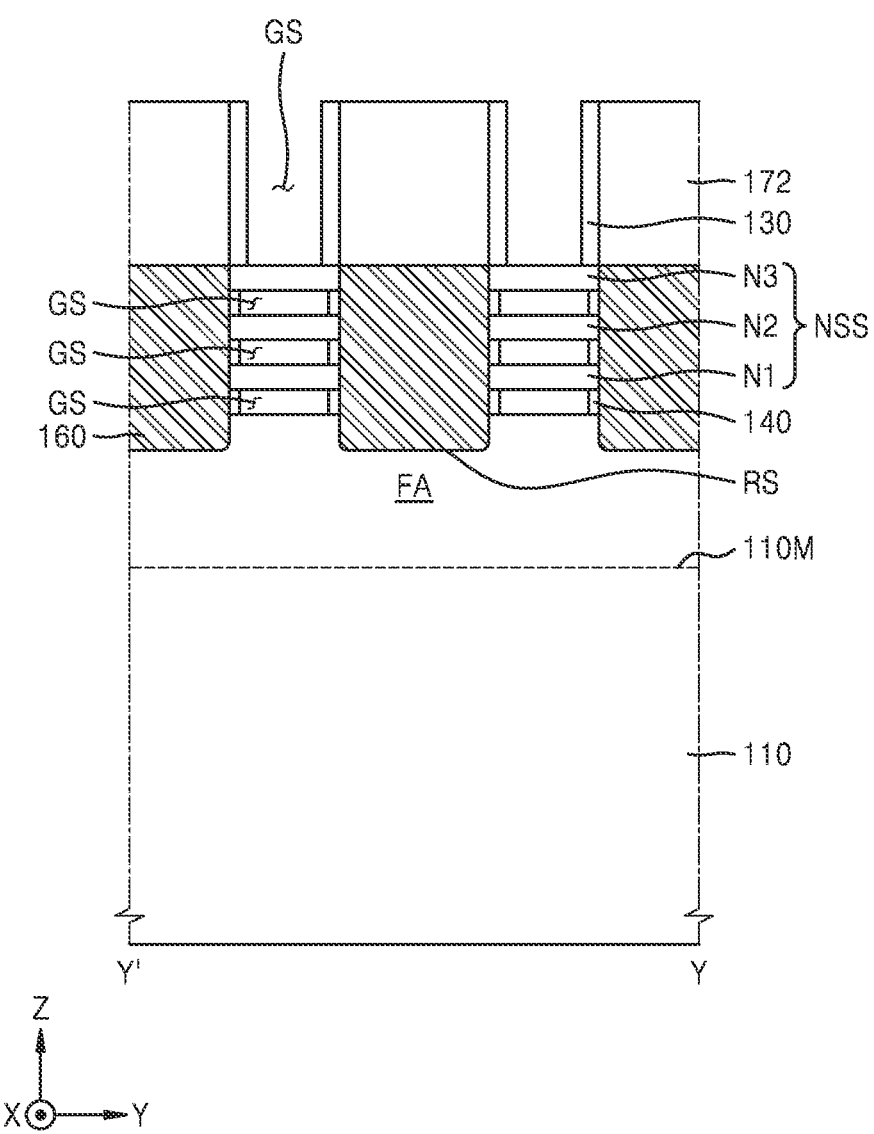

Referring to FIGS. 13A and 13B together, a second insulating barrier BPV covering inner side surfaces of the second power hole PVH and a power via PV covering the second insulating barrier BPV and filling the second power hole PVH are formed. The second insulating barrier BPV and the power via PV may be collectively referred to as a via structure PVS. The power via PV and the via structure PVS may pass through the inter-gate insulating layer 172. The second insulating barrier BPV may cover the inner side surfaces of the second power hole PVH, but may conformally cover the inner side surfaces of the second power hole PVH so as not to fill the second power hole PVH. The second insulating barrier BPV and the power via PV may entirely fill the second power hole PVH. The second insulating barrier BPV may surround the power via PV and may be between the power via PV and the inter-gate insulating layer 172.

For example, the second insulating barrier BPV may include nitride. In some embodiments, the second insulating barrier BPV may include silicon nitride. In some embodiments, the power via PV may include a conductive barrier layer and a conductive core layer covering the conductive barrier layer. The conductive barrier layer may include titanium (Ti), tantalum (Ta), titanium nitride (TiN), tantalum nitride (TaN) or a combination thereof, and the conductive core layer may include cobalt (Co), tungsten (W), copper (Cu), or a combination thereof.

The power via PV may be formed to have a tapered shape in which a horizontal width thereof decreases from an upper side thereof toward a lower side thereof in the vertical direction (Z direction). The power via PV may be formed to decrease in horizontal width toward the main surface 110M of the substrate 110.

Referring to FIGS. 11C, 13A, 14A, and 14B together, a plurality of gate spaces GS are formed by removing the dummy gate layer D14, which is exposed through the inter-gate insulating layer 172 and the gate spacer 130, the oxide layer D12 under the dummy gate layer D14, and at least portions of the plurality of sacrificial semiconductor layers 106S remaining on the fin-type active region FA. The stacked structure NSS of the plurality of nanosheets N1, N2, and N3 that are apart from each other in the vertical direction (Z direction) may be arranged on an upper surface of each of the plurality of fin-type active regions FA. Surfaces of the plurality of nanosheets N1, N2, and N3 and a portion of the upper surface of the fin-type active region FA may be exposed through the gate space GS. In some embodiments, portions of the plurality of sacrificial semiconductor layers 106S may remain without being removed. For example, a portion of the sacrificial semiconductor layer 106S on the upper surface of the fin-type active region FA may remain without being removed.

Referring to FIGS. 14A, 14B, 15A, 15B, and 15C together, a gate dielectric layer 145 is formed on surfaces exposed in the plurality of gate spaces GS and a plurality of gate electrodes 150 respectively filling the plurality of gate spaces GS are formed on the gate dielectric layer 145. The plurality of gate electrodes 150 may extend parallel to each other in the first horizontal direction (X direction). The gate electrode 150 may be the gate electrode GL shown in FIG. 1.

The gate dielectric layer 145 may have a stacked structure of an interfacial layer and a high-k dielectric layer. In some embodiments, the interfacial layer may include a low-k dielectric material layer having a dielectric constant of about 9 or less, for example, silicon oxide, silicon oxynitride, or a combination thereof. In some embodiments, the interfacial layer may be omitted. The high-k dielectric layer may include a material having a greater dielectric constant than silicon oxide. For example, the high-k dielectric layer may have a dielectric constant of about 10 to about 25.

The high-k dielectric layer may include a material selected from hafnium oxide, hafnium oxynitride, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and a combination thereof, but the material of the high-k dielectric layer is not limited thereto. The high-k dielectric layer may be formed by an atomic layer deposition (ALD), chemical vapor deposition (CVD), or physical vapor deposition (PVD) process. The high-k dielectric layer may have a thickness of about 10 Å to about 40 Å, but embodiments are not limited thereto.

In some embodiments, the gate dielectric layer 145 may include a ferroelectric material layer having ferroelectric properties or a paraelectric material layer having paraelectric properties. For example, the gate dielectric layer 145 may include one ferroelectric material layer. For example, the gate dielectric layer 145 may include a plurality of ferroelectric material layers that are apart from each other. For example, the gate dielectric layer 145 may have a stacked structure in which a plurality of ferroelectric material layers and a plurality of paraelectric material layers are alternately stacked.

The ferroelectric material layer may have a negative capacitance, and the paraelectric material layer may have a positive capacitance. For example, when two or more capacitors are connected in series and the capacitance of each capacitor has a positive value, the total capacitance becomes less than the capacitance of each individual capacitor. However, when at least one of the capacitances of two or more capacitors that are connected in series has a negative value, the total capacitance may have a positive value and be greater than the absolute value of each individual capacitance.

When the ferroelectric material layer having a negative capacitance and the paraelectric material layer having a positive capacitance are connected in series, a total capacitance value of the ferroelectric material layer and the paraelectric material layer connected in series may increase. By using the increase in the total capacitance value, a transistor including the ferroelectric material layer may have a sub-threshold swing (SS) of less than 60 mV/decade at room temperature.

The ferroelectric material layer may have ferroelectric properties. The ferroelectric material layer may include, for example, at least one of hafnium oxide, hafnium zirconium oxide, barium strontium titanium oxide, barium titanium oxide, and lead zirconium titanium oxide. Here, for example, hafnium zirconium oxide may be a material obtained by doping hafnium oxide with zirconium (Zr). As another example, hafnium zirconium oxide may be a compound of hafnium (Hf), Zr, and oxygen (O).

The ferroelectric material layer may further include a doped dopant. For example, the dopant may include at least one of aluminum (Al), Ti, niobium (Nb), lanthanum (La), yttrium (Y), magnesium (Mg), Si, calcium (Ca), cerium (Ce), dysprosium (Dy), erbium (Er), gadolinium (Gd), Ge, scandium (Sc), strontium (Sr), and tin (Sn). Depending on which ferroelectric material the ferroelectric material layer includes, the type of dopant included in the ferroelectric material layer may vary.

When the ferroelectric material layer includes hafnium oxide, the dopant included in the ferroelectric material layer may include, for example, at least one of Gd, Si, Zr, Al, and Y.

When the dopant is Al, the ferroelectric material layer may include about 3 atomic % (at %) to about 8 at % of Al. Here, a ratio of the dopant may be a ratio of Al to the sum of Hf and Al.

When the dopant is Si, the ferroelectric material layer may include about 2 at % to about 10 at % of Si. When the dopant is Y, the ferroelectric material layer may include about 2 at % to about 10 at % of Y. When the dopant is Gd, the ferroelectric material layer may include about 1 at % to about 7 at % of Gd. When the dopant is Zr, the ferroelectric material layer may include about 50 at % to about 80 at % of Zr.

The paraelectric material layer may have paraelectric properties. The paraelectric material layer may include, for example, at least one of silicon oxide and a metal oxide having a high dielectric constant. The metal oxide included in the paraelectric material layer may include, for example, at least one of hafnium oxide, zirconium oxide, and aluminum oxide, but embodiments are not limited thereto.

The ferroelectric material layer and the paraelectric material layer may include the same material. The ferroelectric material layer may have ferroelectric properties, but the paraelectric material layer may not have ferroelectric properties. For example, when the ferroelectric material layer and the paraelectric material layer include hafnium oxide, a crystal structure of the hafnium oxide included in the ferroelectric material layer is different from a crystal structure of the hafnium oxide included in the paraelectric material layer.

The ferroelectric material layer may have a thickness suitable for having ferroelectric properties. A thickness of the ferroelectric material layer may be, for example, about 0.5 nm to about 10 nm, but embodiments are not limited thereto. Because a critical thickness indicating ferroelectric properties may vary for each ferroelectric material, the thickness of the ferroelectric material layer may vary depending on the ferroelectric material.

The gate electrode 150 may include a metal-containing layer for regulating a work function and a gap-fill metal-containing layer for filling an upper space of the metal-containing layer for regulating a work function. In some embodiments, the gate electrode 150 may have a structure in which a metal nitride layer, a metal layer, a conductive capping layer, and a gap-fill metal layer are sequentially stacked. The metal nitride layer and the metal layer may include at least one metal selected from Ti, Ta, W, ruthenium (Ru), Nb, molybdenum (Mo), and Hf. The gap-fill metal layer may include a W layer or an Al layer.

The gate electrode 150 may include a work function metal-containing layer. The work function metal-containing layer may include at least one metal selected from Ti, W, Ru, Nb, Mo, Hf, nickel (Ni), Co, platinum (Pt), ytterbium (Yb), terbium (Tb), Dy, Er, and palladium (Pd). In some embodiments, each of the gate electrodes 150 may include a stacked structure of Al-doped titanium carbide (TiAlC)/TiN/W, a stacked structure of TiN/TaN/TiAlC/TiN/W, or a stacked structure of TiN/TaN/TiN/TiAlC/TiN/W, but embodiments are not limited thereto.

In some embodiments, a plurality of gate capping layers may be arranged on the plurality of gate electrodes 150. The plurality of gate capping layers may include silicon nitride. Similar to the plurality of gate electrodes 150, the plurality of gate capping layers may extend parallel to each other in the first horizontal direction (X direction) on the plurality of gate electrodes 150.

The gate electrode 150 may include a main gate portion 150M and a plurality of sub-gate portions 150S, the main gate portion 150M covering an upper surface of the nanosheet stacked structure NSS including the plurality of nanosheets N1, N2, and N3 and the plurality of sub-gate portions 150S being connected to the main gate portion 150M and formed in spaces between each of the plurality of nanosheets N1, N2, and N3 and the fin-type active region FA. A plurality of insulating spacers 140 may be arranged on both ends of each of the plurality of sub-gate portions 150S with the gate dielectric layer 145 therebetween.

Figure 15A:
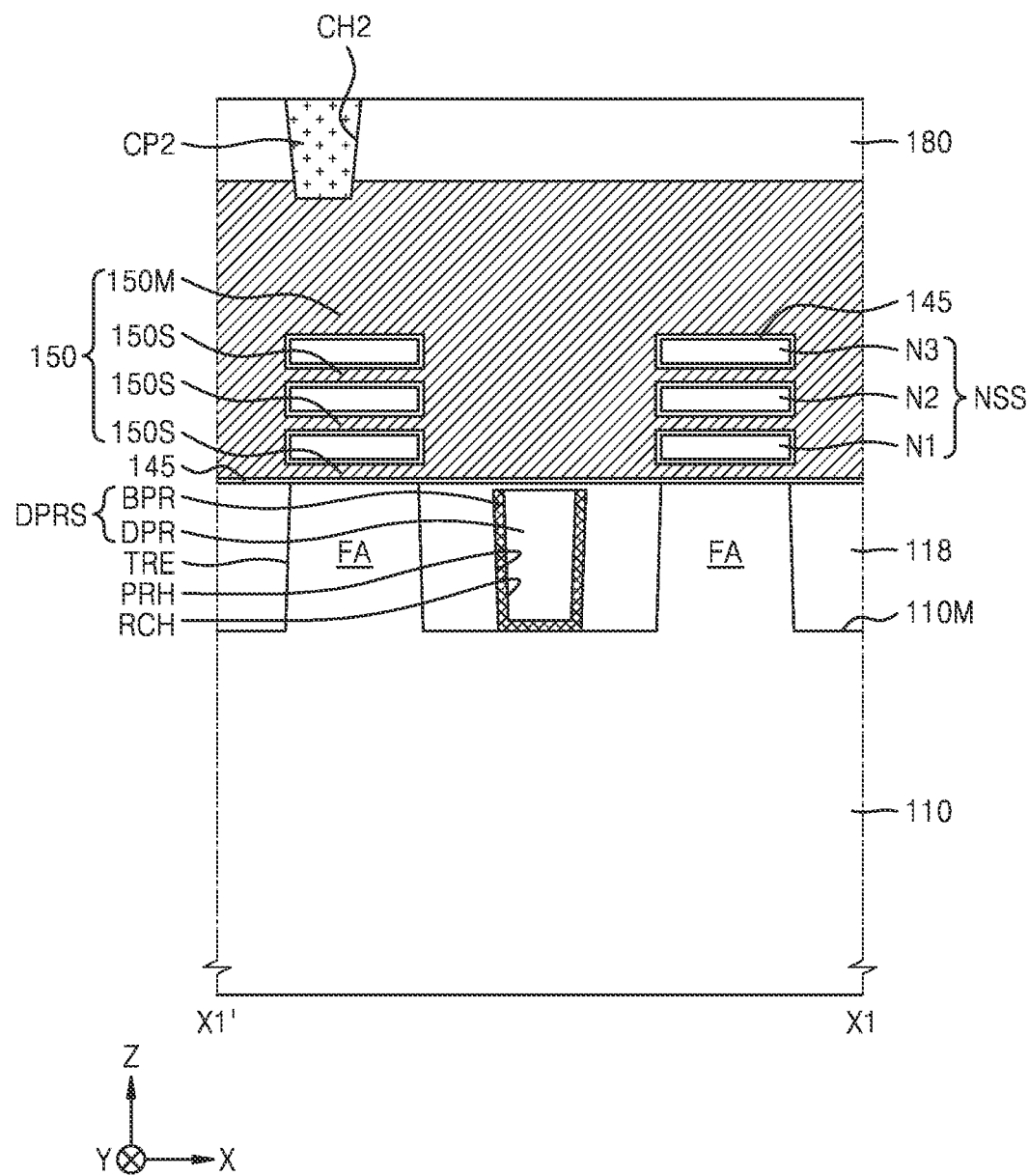

Although FIG. 15A shows that the gate electrode 150 extends over the dummy rail structure DPRS in the first horizontal direction (X direction), embodiments are not limited thereto. For example, similar to the gate electrode GL shown in FIG. 1B, which has one end thereof cut adjacent to the buried rail PR in a plan view so as not to overlap the buried rail PR in the vertical direction (Z direction), the gate electrode 150 may have one end thereof extending in the first horizontal direction (X direction) and cut adjacent to the dummy rail structure DPRS in a plan view so as not to overlap the dummy rail structure DPRS in the vertical direction (Z direction).

In some embodiments, a portion of the device separation layer 118 may be between the gate dielectric layer 145 and the dummy rail structure DPRS, that is, between the gate dielectric layer 145 and the first insulating barrier BPR and between the gate dielectric layer 145 and the dummy buried rail DPR. For example, before forming the inter-gate insulating layer 172 or before forming the gate dielectric layer 145 and the gate electrode 150, an upper portion of the dummy rail structure DPRS shown in FIG. 10A may be removed and, then, a portion of the device separation layer 118 that covers the upper surface of the dummy rail structure DPRS from which the upper portion has been removed may be further formed.

Also, by removing a portion of the inter-gate insulating layer 172, a first plug hole CH1 passing through the inter-gate insulating layer 172 to expose the source/drain region 160 is formed and the first conductive plug CP1 filling the first plug hole CH1 is formed. In the process of forming the first plug hole CH1, a portion of the via structure PVS, for example, a portion of the second insulating barrier BPV, may also be removed to expose the power via PV in the first plug hole CH1. The first conductive plug CP1 may electrically connect the power via PV to the source/drain region 160. In some embodiments, the first conductive plug CP1 may be formed before forming the gate dielectric layer 145 and the gate electrode 150. The first conductive plug CP1 may be formed to extend in a direction crossing the plurality of fin-type active regions FA. For example, the first conductive plug CP1 may extend in the first horizontal direction (X direction).

An interlayer insulating layer 180 may be arranged on the first conductive plug CP1 and the gate electrode 150. For example, the interlayer insulating layer 180 may include an insulating material, such as a high density plasma (HDP) oxide, a tetraethyl orthosilicate (TEOS) oxide, a tonen silazane (TOSZ), a spin on glass (SOG), an undoped silica glass (USG), or a low-k dielectric.

After forming a second plug hole CH2 passing through the interlayer insulating layer 180 to expose the gate electrode 150, the second conductive plug CP2 filling the second plug hole CH2 may be formed. For example, the second conductive plug CP2 may pass through the interlayer insulating layer 180 to be electrically connected to the gate electrode 150. In some embodiments, when the gate capping layer is arranged on the gate electrode 150, the second plug hole CH2 may be formed to pass through the interlayer insulating layer 180 and the gate capping layer to expose the gate electrode 150. For example, the second conductive plug CP2 may pass through the interlayer insulating layer 180 and the gate capping layer to be electrically connected to the gate electrode 150.

Each of the first conductive plug CP1 and the second conductive plug CP2 may include a conductive barrier layer and a conductive core layer covering the conductive barrier layer. The conductive barrier layer may include Ti, Ta, TiN, TaN, or a combination thereof, and the conductive core layer may include Co, W, Cu, or a combination thereof.

Each of the first conductive plug CP1 and the second conductive plug CP2 may be formed to have a tapered shape in which a horizontal width thereof decreases from an upper side thereof toward a lower side thereof in the vertical direction (Z direction). Each of the first conductive plug CP1 and the second conductive plug CP2 may be formed to decrease in horizontal width toward the substrate 110.

Figure 15B:
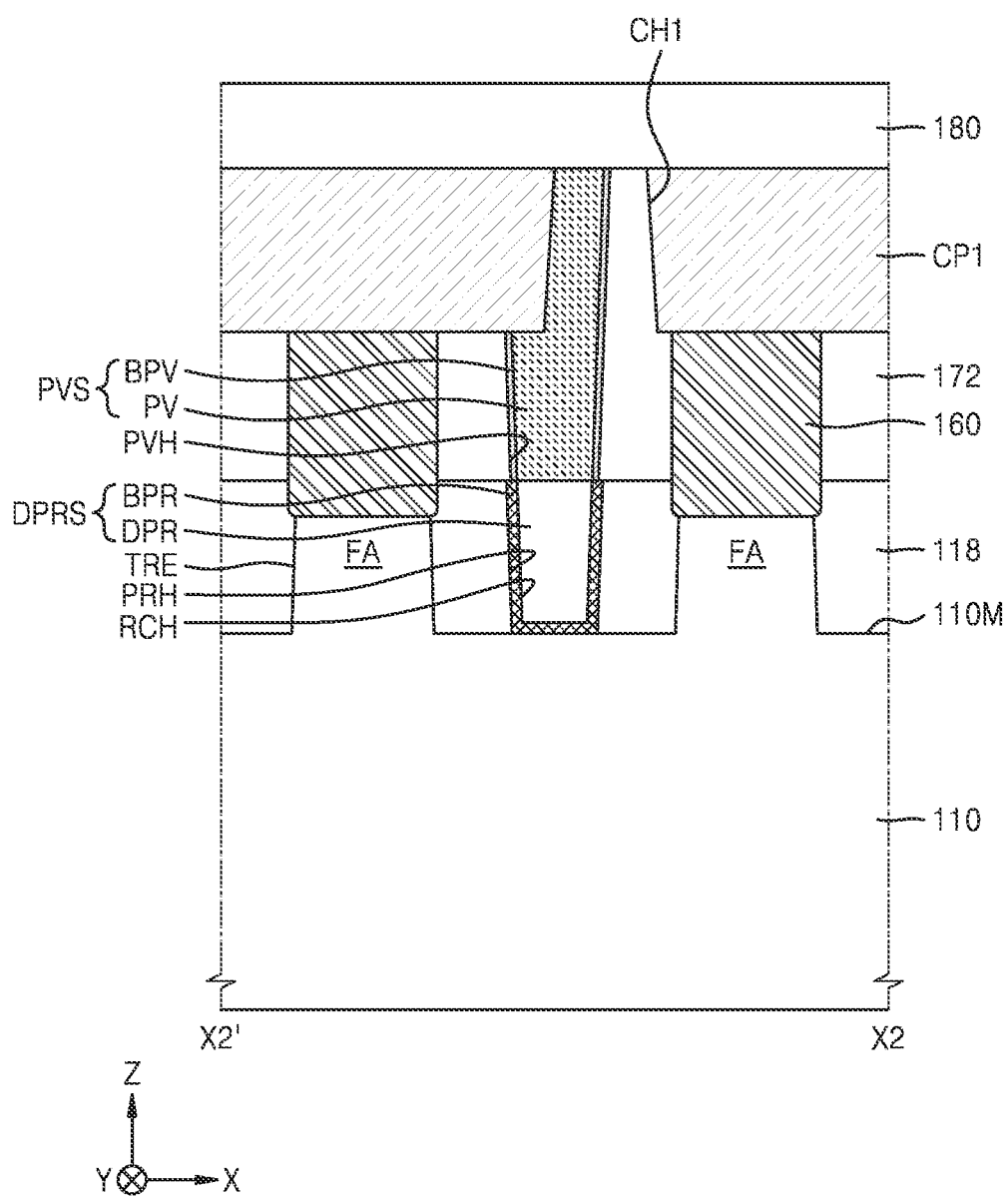
Figure 15C:
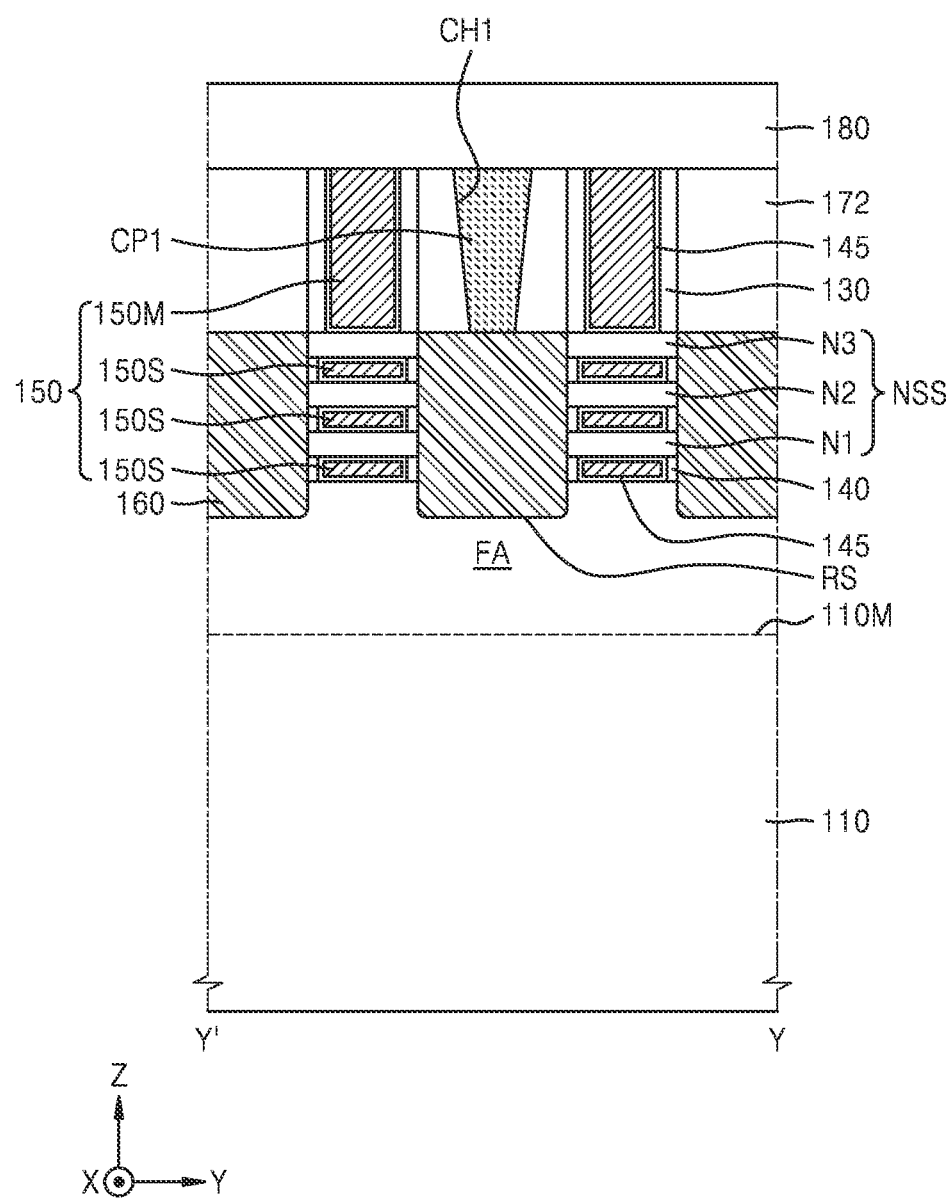
Figure 16:
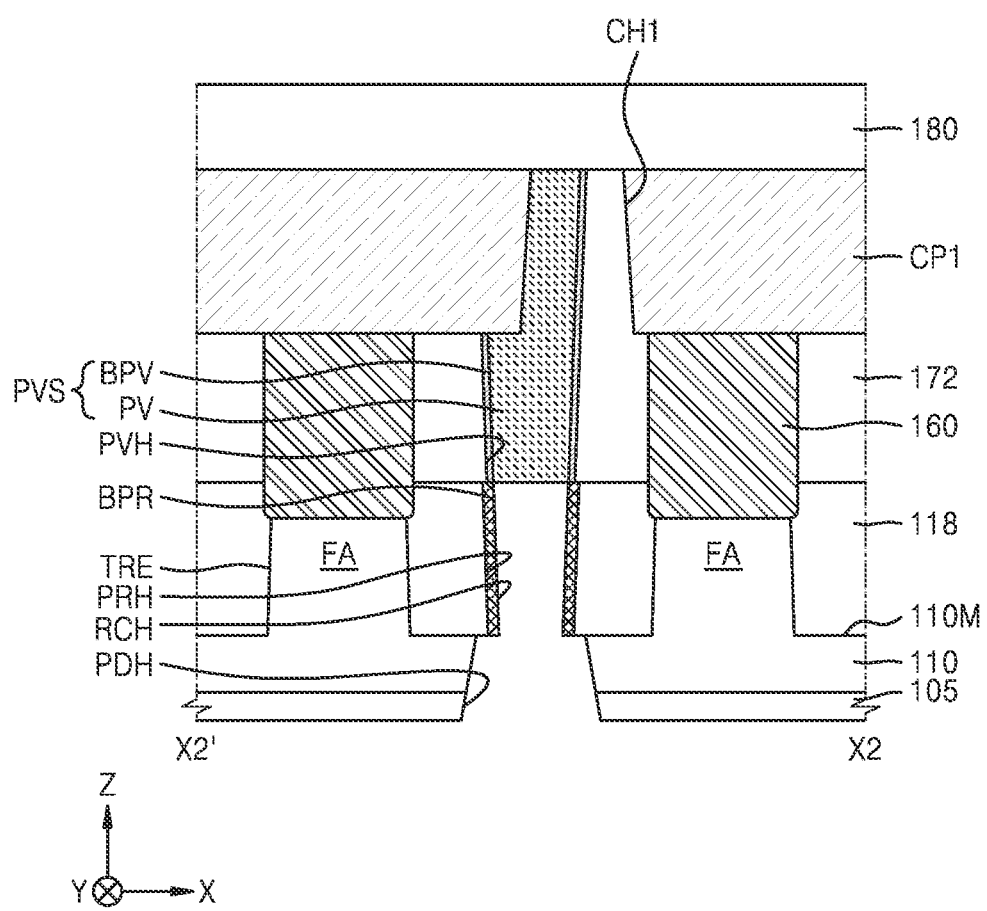

Referring to FIGS. 15A to 16 together, a lower portion of the substrate 110 is removed, and a lower insulating layer 105 covering a lower surface of the substrate 110 is formed. Thereafter, a wiring recess PDH exposing the dummy rail structure DPRS is formed by removing portions of the lower insulating layer 105 and the substrate 110 and the dummy buried rail DPR is removed through the wiring recess PDH. Because the dummy buried rail DPR is removed, the limited space RCH may be defined in the first power hole PRH by the first insulating barrier BPR.

The lower insulating layer 105 may include an insulating layer including at least one of silicon oxide ($SiO_x$), silicon nitride (SiN), silicon oxynitride (SiON), germanium oxide ($GeO_x$), germanium nitride ($GeN_x$), aluminum oxide ($Al_2O_3$), tantalum oxide ($Ta_2O_5$), hafnium oxide ($HfO_2$), and aluminum nitride (AlN) or may have a stacked structure of at least two insulating layers including the above materials.

Figure 17:
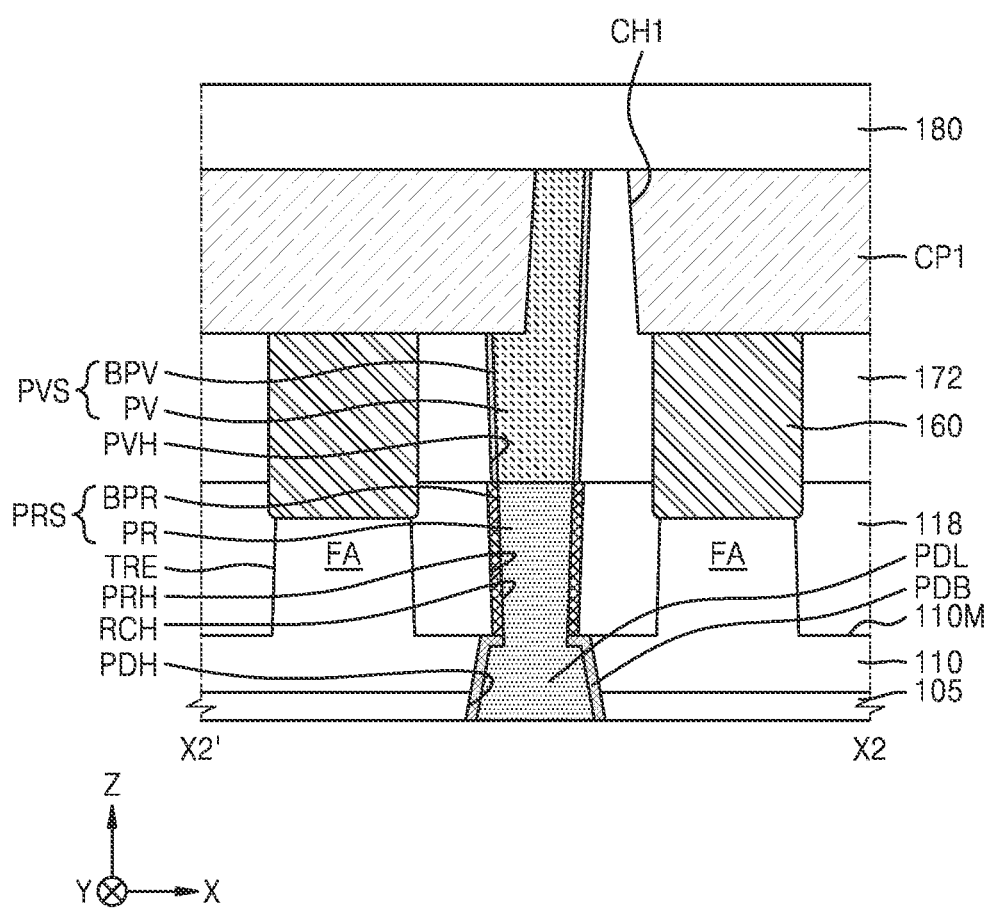

Referring to FIGS. 16 and 17 together, after forming a wiring barrier PDB covering inner surfaces of the wiring recess PDH, that is, the lower insulating layer 105, the substrate 110, the device separation layer 118, and the first insulating barrier BPR that are exposed in the wiring recess PDH, a power wiring line PDL and the buried rail PR are formed to fill the wiring recess PDH and the limited space RCH. In some embodiments, the buried rail PR and the power wiring line PDL may be integrally formed as a single body. For example, the buried rail PR and the power wiring line PDL may include the same material. Because the buried rail PR is formed to fill the limited space RCH, the buried rail PR may be formed to be connected to the power via PV through self-alignment. The power wiring line PDL, the buried rail PR, and the power via PV may constitute a power transmission network. The first insulating barrier BPR and the buried rail PR may be collectively referred to as a rail structure PRS. The buried rail PR and the rail structure PRS may pass through the device separation layer 118. The first insulating barrier BPR may cover inner side surfaces of the first power hole PRH, but may conformally cover the inner side surfaces of the first power hole PRH so as not to fill the first power hole PRH. The first insulating barrier BPR and the buried rail PR may entirely fill the first power hole PRH. The first insulating barrier BPR may surround the buried rail PR and may be between the buried rail PR and the device separation layer 118.

The buried rail PR may be formed to have a tapered shape in which a horizontal width thereof decreases from an upper side thereof toward a lower side thereof in the vertical direction (Z direction). The buried rail PR may be formed to decrease in horizontal width toward the power wiring line PDL. The power wiring line PDL may pass through the substrate 110 and the lower insulating layer 105. The power wiring line PDL may be formed to have a tapered shape in which a horizontal width thereof decreases from a lower side thereof toward an upper side thereof in the vertical direction (Z direction). The power wiring line PDL may be formed to decrease in horizontal width toward the buried rail PR. That is, the buried rail PR and the power wiring line PDL may be formed to decrease in horizontal width toward each other. The wiring barrier PDB may be between the power wiring line PDL and the lower insulating layer 105 and between the power wiring line PDL and the substrate 110. In some embodiments, the wiring barrier PDB may include silicon nitride.

The buried rail PR and the power wiring line PDL may include a buried barrier layer and a buried conductive layer. The buried barrier layer may be formed to conformally cover inner side surfaces and an upper surface of the limited space RCH and inner side surfaces and an upper surface of the wiring recess PDH. The buried conductive layer may be formed to cover a surface of the buried barrier layer and fill the wiring recess PDH and the limited space RCH. The buried barrier layer may include, for example, Ti, Ta, TiN, TaN, or a combination thereof. The buried conductive layer may include, for example, W, Cu, Mo, Ru, Nb, Hf, or a combination thereof.

Figure 18:
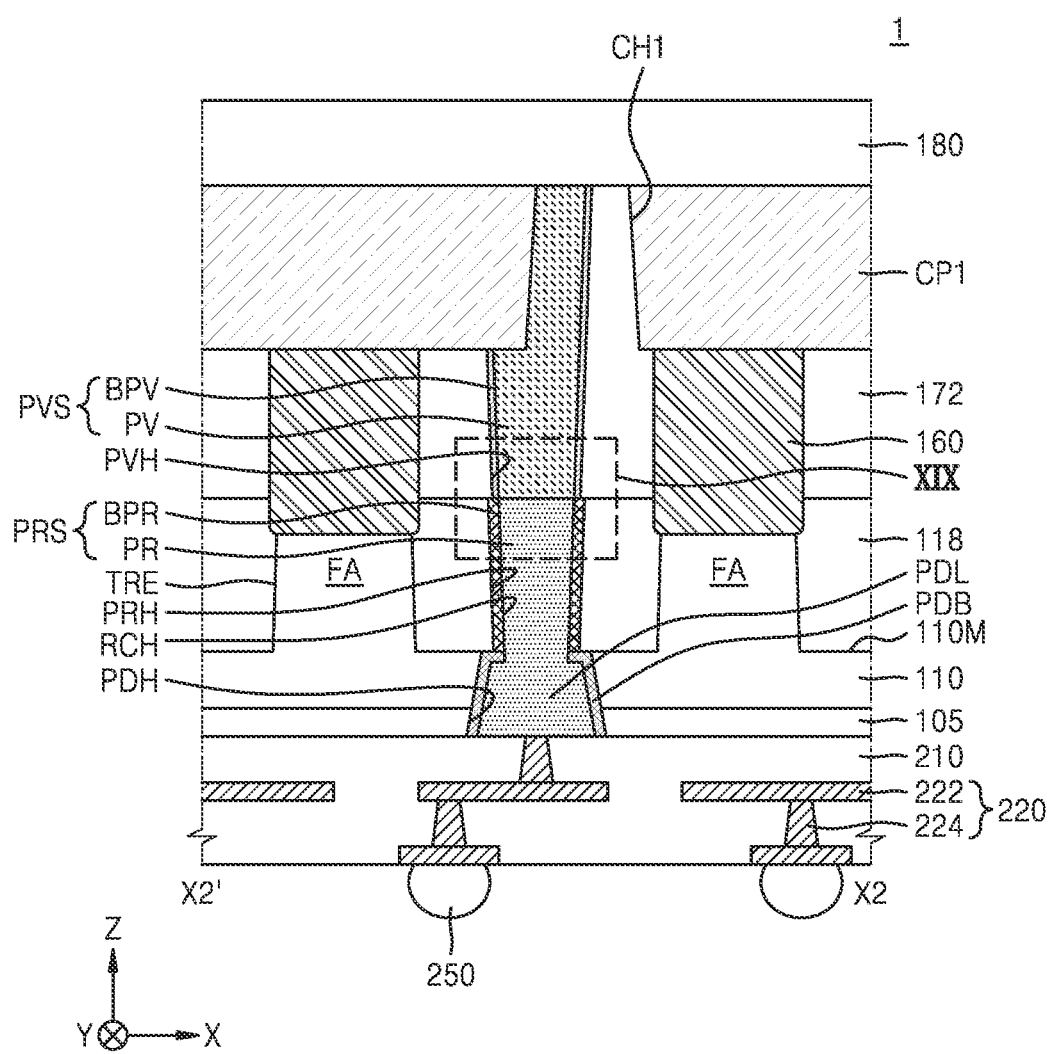
FIG. 18 is a cross-sectional view illustrating an integrated circuit device according to embodiments.

FIG. 18 is a cross-sectional view illustrating an integrated circuit device according to embodiments. Specifically, FIG. 18 is a cross-sectional view taken along a position corresponding to the line X2-X2' of FIG. 1A.

Referring to FIG. 18, an inter-wiring insulating layer 210 and a wiring structure 220 including a wiring line 222 and a wiring via 224 may be formed below the lower insulating layer 105 and the power wiring line PDL. The inter-wiring insulating layer 210 may surround at least portions of the wiring line 222 and the wiring via 224. A portion of the wiring line 222 may be exposed on a lower surface of the inter-wiring insulating layer 210. The portion of the wiring line 222 that is exposed on the lower surface of the inter-wiring insulating layer 210 may function as an external connection pad. An external connection terminal 250 may be attached to the portion of the wiring line 222 that is exposed on the lower surface of the inter-wiring insulating layer 210 and function as an external connection pad.

In a typical integrated circuit device, among both surfaces of a substrate, a semiconductor substrate or a semiconductor layer, a surface on which a transistor, such as a FinFET device, is arranged may be referred to as a front surface and a surface opposite to the front surface may be referred to as a rear surface. The power wiring line PDL, the inter-wiring insulating layer 210, and the wiring structure 220 may be arranged on a surface of the substrate 110 that is opposite to a surface thereof on which the plurality of fin-type active regions FA are formed, that is, on a rear surface of the substrate 110. Also, the gate electrode 150, the source/drain region 160, the first conductive plug CP1, and the second conductive plug CP2 may be arranged on a front surface of the substrate 110.

The integrated circuit device 1 may include the substrate 110 having the plurality of fin-type active regions FA defined by the trench TRE, the device separation layer 118 filling the trench TRE, the buried rail PR in the device separation layer 118, the power via PV connected to the buried rail PR, the source/drain region 160, the first conductive plug CP1 connecting the power via PV to the source/drain region 160, the gate electrode 150, and the second conductive plug CP2 connected to the gate electrode 150. The buried rail PR may be connected to the external connection terminal 250 through the power wiring line PDL.

The plurality of fin-type active regions FA may be arranged at a constant pitch in the first horizontal direction (X direction) and may extend parallel to each other in the second horizontal direction (Y direction). In some embodiments, the stacked structure NSS of the plurality of nanosheets N1, N2, and N3 that are apart from each other in the vertical direction (Z direction) may be arranged on the upper surface of each of the plurality of fin-type active regions FA. The insulating spacer 140 may be between each two of the nanosheets N1, N2, and N3.

The plurality of gate electrodes 150 may extend in the first horizontal direction (X direction) crossing the plurality of fin-type active regions FA. The plurality of gate electrodes 150 may have the same width in the second horizontal direction (Y direction) and may be arranged at a constant pitch in the second horizontal direction (Y direction).

The plurality of source/drain regions 160 may be formed on both sides of the gate electrode 150 on the plurality of fin-type active regions FA. The power via PV and the first conductive plug CP1 may be between each two of the plurality of gate electrodes 150. The inter-gate insulating layer 172 may cover the plurality of source/drain regions 160 and may fill spaces between each two of the plurality of gate electrodes 150. The first conductive plug CP1 may contact at least a portion of the upper surface of the source/drain region 160 to be electrically connected to the source/drain region 160. The power via PV may pass through the inter-gate insulating layer 172 to electrically connect between the first conductive plug CP1 and the buried rail PR. The second conductive plug CP2 may be electrically connected to the gate electrode 150.

The buried rail PR may be arranged in the first power hole PRH passing through the device separation layer 118. The first power hole PRH and the buried rail PR may extend in the second horizontal direction (Y direction). The buried rail PR may be integrally formed as a single body with the power wiring line PDL. For example, the buried rail PR and the power wiring line PDL may include the same material. The buried rail PR may be formed to be connected to the power via PV through self-alignment. The first power hole PRH and the buried rail PR may be formed to have a tapered shape in which a horizontal width thereof decreases from an upper side thereof toward a lower side thereof in the vertical direction (Z direction). The power wiring line PDL may be formed to have a tapered shape in which a horizontal width thereof decreases from a lower side thereof toward an upper side thereof in the vertical direction (Z direction). That is, the buried rail PR and the power wiring line PDL may be formed to decrease in horizontal width toward each other.

The power via PV may be arranged in the second power hole PVH connected to the first power hole PRH. The power via PV may connect the buried rail PR to the first conductive plug CPL. The power via PV and the second power hole PVH may be formed to have a tapered shape in which a horizontal width thereof decreases from an upper side thereof toward a lower side thereof in the vertical direction (Z direction). The first conductive plug CP1 may be formed to extend in a direction crossing the plurality of fin-type active regions FA. For example, the first conductive plug CP1 may extend in the first horizontal direction (X direction). Each of the first conductive plug CP1 and the second conductive plug CP2 may be formed to have a tapered shape in which a horizontal width thereof decreases from an upper side thereof toward a lower side thereof in the vertical direction (Z direction).

In the integrated circuit device 1 according to embodiments, power provided through the external connection terminal 250 may be supplied to the source/drain region 160 through the power wiring line PDL, the buried rail PR, the power via PV, and the first conductive plug CPL.

FIGS. 19A to 19D are partial cross-sectional views illustrating an integrated circuit device according to embodiments. Specifically, FIGS. 19A to 19D are enlarged cross-sectional views illustrating a region XIX of FIG. 18.

Figure 19A:
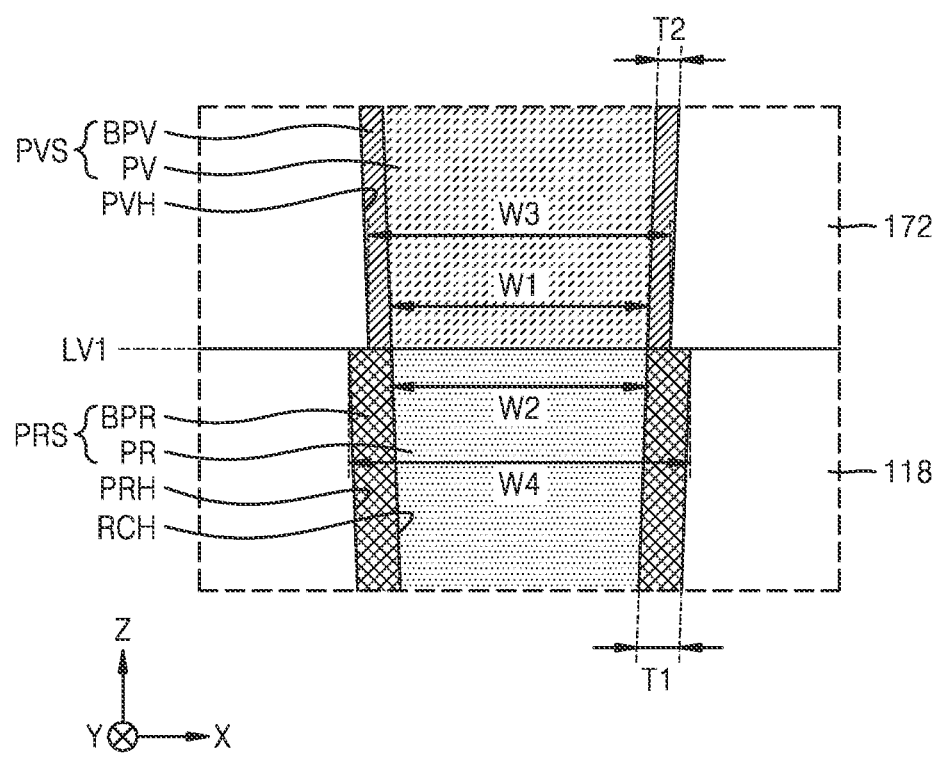
FIGS. 19A to 19D are partially enlarged views illustrating an integrated circuit device according to embodiments.

Referring to FIG. 19A, the first insulating barrier BPR may have a first thickness T1 on the inner side surfaces of the first power hole PRH and the second insulating barrier BPV may have a second thickness T2 on the inner side surfaces of the second power hole PVH. The first thickness T1 may be greater than the second thickness T2. In the horizontal direction, a lowermost end of the power via PV may have a first width W1 and an uppermost end of the buried rail PR may have a second width W2. The second width W2 may be a width of an uppermost end of the limited space RCH defined by the first insulating barrier BPR in the first power hole PRH or may be a width of an uppermost end of the dummy buried rail DPR. The first width W1 and the second width W2 may be substantially the same. In the horizontal direction, a lowermost end of the second power hole PVH may have a third width W3 and an uppermost end of the first power hole PRH may have a fourth width W4. The third width W3 may be less than the fourth width W4 and may be greater than the second width W2.

Referring to FIGS. 19A and 12B together, the third width W3 of the lowermost end of the second power hole PVH may be less than the fourth width W4 of the uppermost end of the first power hole PRH and may be greater than the second width W2 of the uppermost end of the limited space RCH. Accordingly, in the process of forming the second power hole PVH, only the dummy rail structure DPRS may be exposed on the lower surface of the second power hole PVH and the device separation layer 118 may not be exposed. Also, an edge of the lower surface of the second power hole PVH may be on the first insulating barrier BPR.

Referring to FIG. 19A and FIG. 17 together, the second insulating barrier BPV may have the second thickness T2 that is less than the first thickness T1 on the inner side surfaces of the second power hole PVH and the first width W1 of the lowermost end of the power via PV may be substantially the same as the second width W2 of the uppermost end of the buried rail PR. Accordingly, the buried rail PR may be formed to be connected to the power via PV through self-alignment and the uppermost end of the buried rail PR and the lowermost end of the power via PV may contact each other. Accordingly, the connection reliability between the buried rail PR and the power via PV may be increased.

Figure 19B:
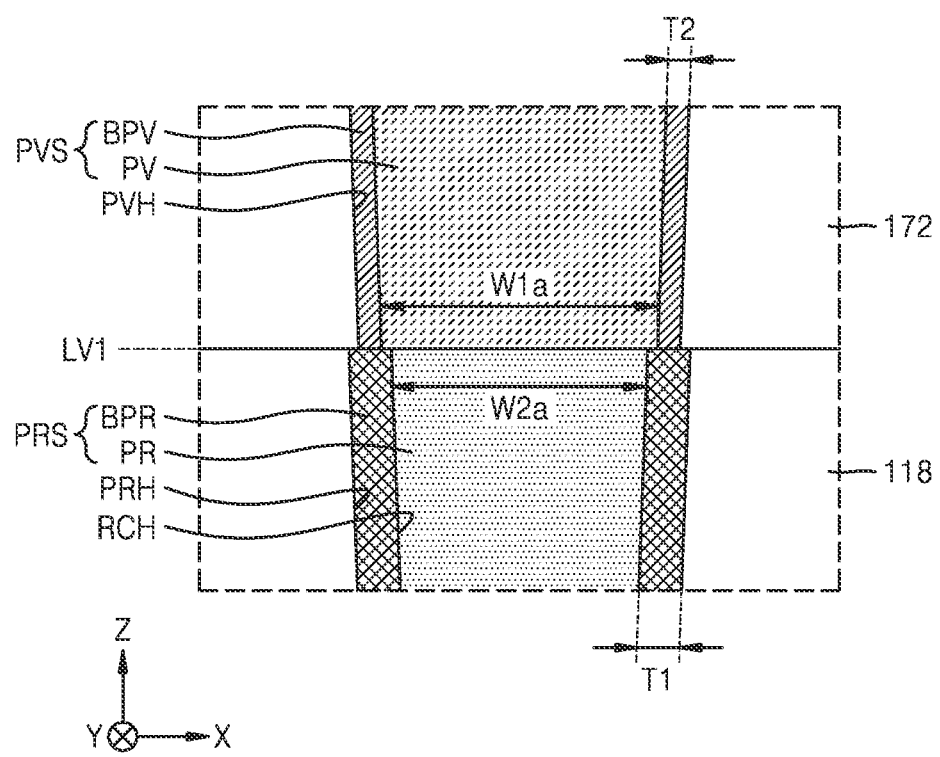

Referring to FIG. 19B, the first insulating barrier BPR may have the first thickness T1 on the inner side surfaces of the first power hole PRH and the second insulating barrier BPV may have the second thickness T2 on the inner side surfaces of the second power hole PVH. The first thickness T1 may be greater than the second thickness T2. In the horizontal direction, the lowermost end of the power via PV may have a first width W1a and the uppermost end of the buried rail PR may have a second width W2a. The first width W1a may be greater than the second width W2a.

Referring to FIGS. 19B and 17 together, the second insulating barrier BPV may have the second thickness T2 that is less than the first thickness T1 on the inner side surfaces of the second power hole PVH, and the first width W1a of the lowermost end of the power via PV may be greater than the second width W2a of the uppermost end of the buried rail PR.

Accordingly, the buried rail PR may be formed to be connected to the power via PV through self-alignment, and all portions of the uppermost end of the buried rail PR may contact portions of the lowermost end of the power via PV. Accordingly, the connection reliability between the buried rail PR and the power via PV may be increased.

Figure 19C:
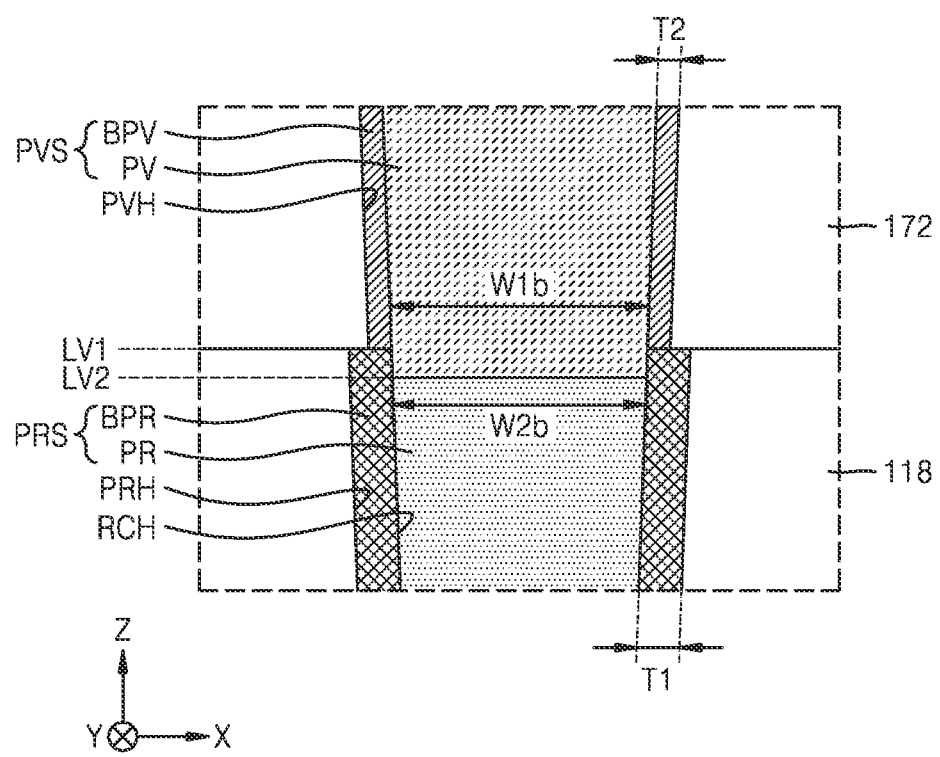

Referring to FIG. 19C, the first insulating barrier BPR may have the first thickness T1 on the inner side surfaces of the first power hole PRH and the second insulating barrier BPV may have the second thickness T2 on the inner side surfaces of the second power hole PVH. The first thickness T1 may be greater than the second thickness T2. In the horizontal direction, the lowermost end of the power via PV may have a first width W1b and the uppermost end of the buried rail PR may have a second width W2b. The first width W1b and the second width W2b may be substantially the same.

An uppermost end of the first insulating barrier BPR may contact a lowermost end of the second insulating barrier BPV at a first vertical level LV1, and the lowermost end of the power via PV may contact the uppermost end of the buried rail PR at a second vertical level LV2. The second vertical level LV2 may be at a lower vertical level than the first vertical level LV1. The power via PV may extend from the second power hole PVH into the first power hole PRH. For example, the power via PV may extend from the second power hole PVH into the limited space RCH defined by the first insulating barrier BPR in the first power hole PRH. That is, the limited space RCH may be entirely filled by a portion of the power via PV and the buried rail PR.

Referring to FIGS. 19C, 12B, and 13B together, in the process of forming the lowermost end of the second power hole PVH, an upper portion of the dummy rail structure DPRS may also be removed. Also, referring to FIGS. 19C and 13B together, the power via PV may be formed to fill the second power hole PVH and an upper portion of the limited space RCH from which an upper portion of the dummy rail structure DPRS has been removed.

Referring to FIGS. 19C and 17 together, the uppermost end of the buried rail PR and the lowermost end of the power via PV may contact each other in the limited space RCH defined by the first insulating barrier BPR. The buried rail PR may fill a lower portion of the first power hole PRH, that is, a lower portion of the limited space RCH, and the power via PV may fill an upper portion of the first power hole PRH, that is, an upper portion of the limited space RCH. Accordingly, because an interface between the buried rail PR and the power via PV is surrounded by the first insulating barrier BPR, the connection reliability between the buried rail PR and the power via PV may be increased.

Figure 19D:
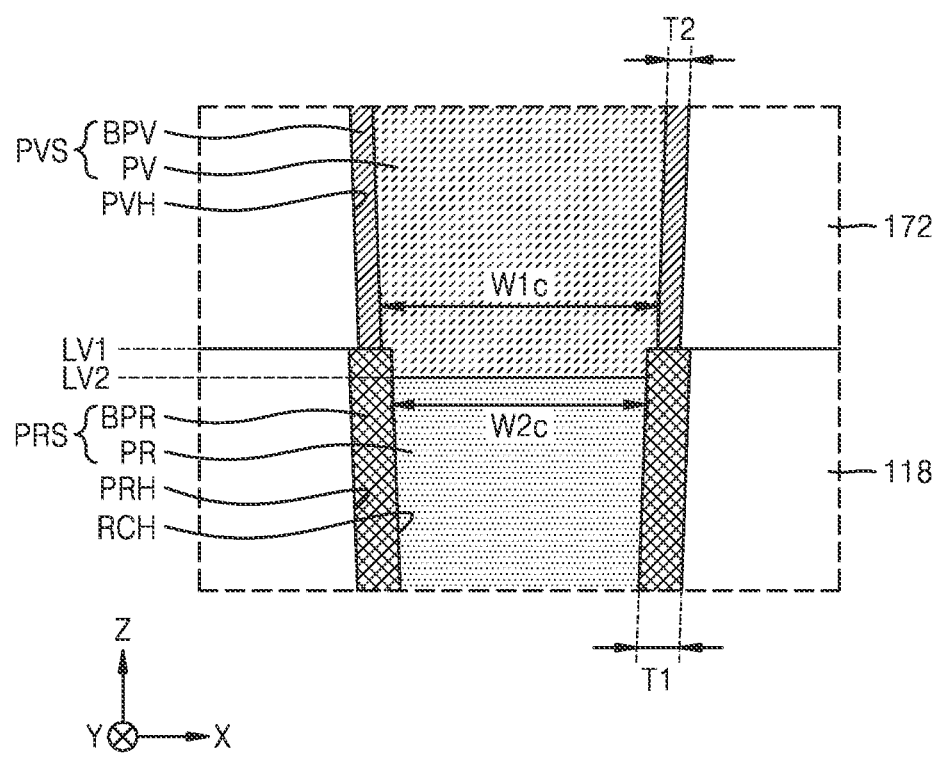

Referring to FIG. 19D, the first insulating barrier BPR may have the first thickness T1 on the inner side surfaces of the first power hole PRH and the second insulating barrier BPV may have the second thickness T2 on the inner side surfaces of the second power hole PVH. The first thickness T1 may be greater than the second thickness T2.

The uppermost end of the first insulating barrier BPR may contact the lowermost end of the second insulating barrier BPV at the first vertical level LV1, and the lowermost end of the power via PV may contact the uppermost end of the buried rail PR at the second vertical level LV2. The second vertical level LV2 may be at a lower vertical level than the first vertical level LV1. The power via PV may extend into the limited space RCH defined by the first insulating barrier BPR in the first power hole PRH. That is, the limited space RCH may be entirely filled by a portion of the power via PV and the buried rail PR.

At the first vertical level LV1, the power via PV may have a first width W1c in the horizontal direction and the uppermost end of the buried rail PR may have a second width W2c. The first width W1c may be greater than the second width W2c. The second width W2c may be a width of the power via PV at the second vertical level LV2, that is, a width of the lowermost end of the power via PV.

Referring to FIGS. 19D, 12B, and 13B together, in the process of forming the lowermost end of the second power hole PVH, an upper portion of the dummy rail structure DPRS may also be removed. Also, referring to FIGS. 19D and 13B together, the power via PV may be formed to fill the second power hole PVH and an upper portion of the limited space RCH from which an upper portion of the dummy rail structure DPRS has been removed.

Referring to FIGS. 19D and 17 together, the uppermost end of the buried rail PR and the lowermost end of the power via PV may contact each other in the limited space RCH defined by the first insulating barrier BPR. Accordingly, because the interface between the buried rail PR and the power via PV is surrounded by the first insulating barrier BPR, the connection reliability between the buried rail PR and the power via PV may be increased.

Figure 20:
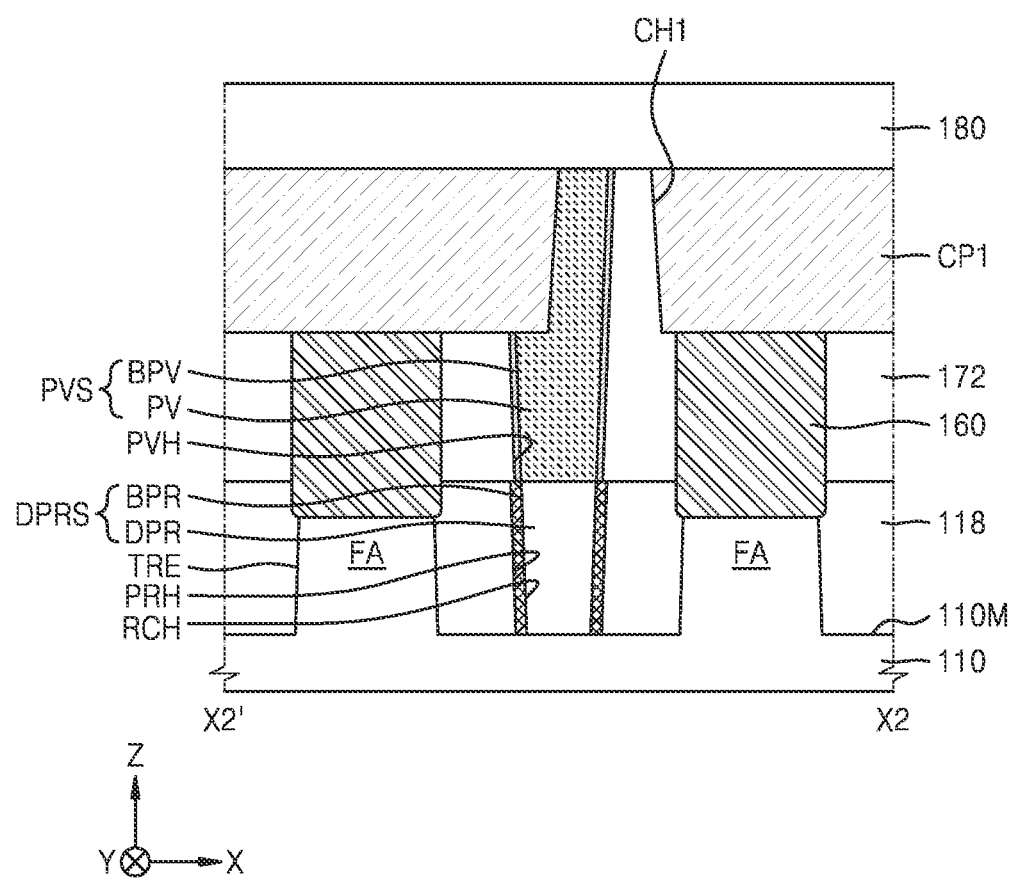
FIGS. 20 to 22 are cross-sectional views illustrating a method of manufacturing an integrated circuit device, according to embodiments.
Figure 21:
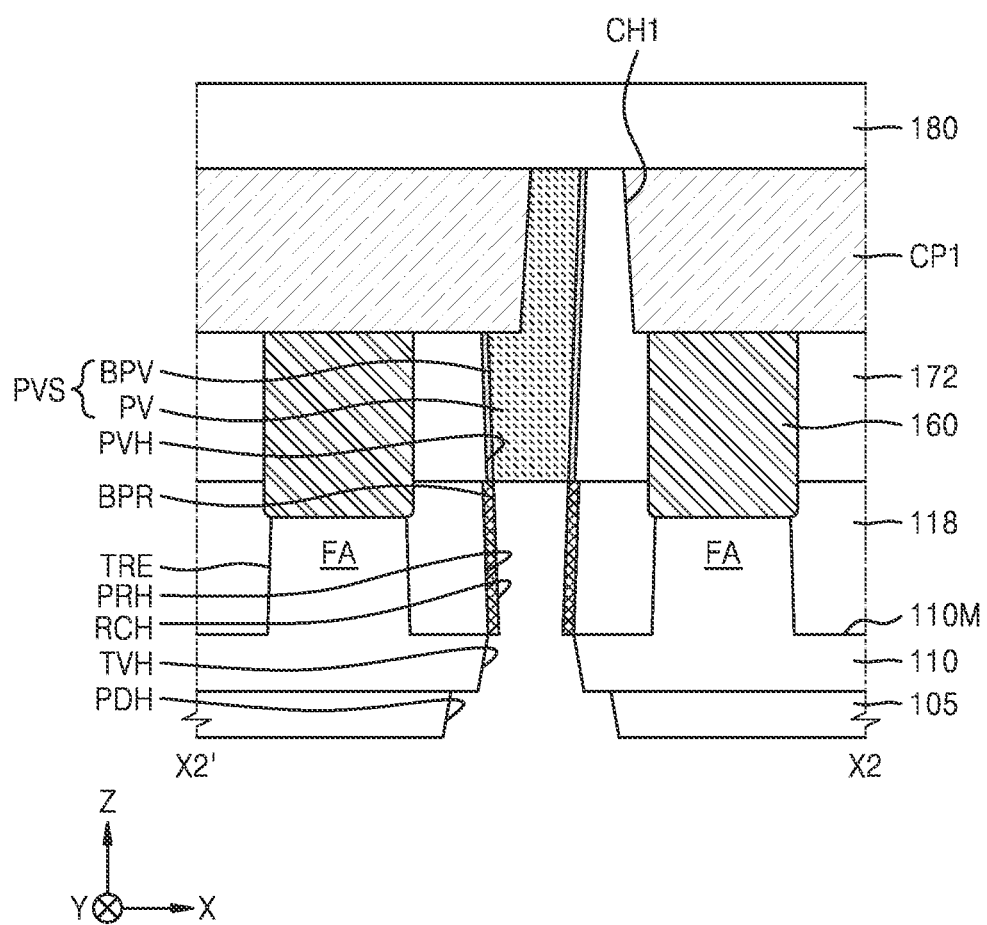
Figure 22:
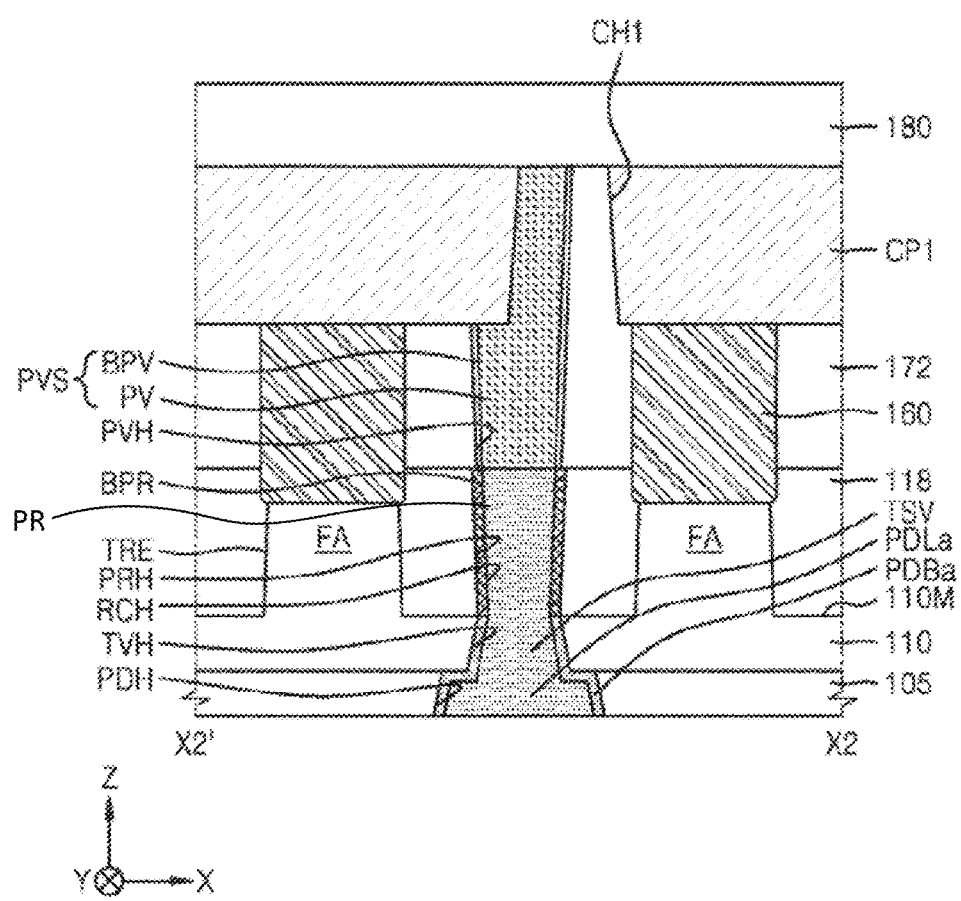

FIGS. 20 to 22 are cross-sectional views illustrating a method of manufacturing an integrated circuit device, according to embodiments. Specifically, FIGS. 20 to 22 are cross-sectional views taken along a position corresponding to the line X2-X2' of FIG. 1A.

Referring to FIGS. 15B and 20 together, a lower portion of the substrate 110 is removed such that the dummy rail structure DPRS is not exposed.

Referring to FIGS. 20 and 21 together, a through hole TVH is formed by removing a lower portion of the substrate 110 and a portion of the lower surface of the substrate 110. The dummy rail structure DPRS may be exposed on an upper surface of the through hole TVH. The through hole TVH may be connected to the first power hole PRH. The through hole TVH may pass through the substrate 110.

Thereafter, the lower insulating layer 105 covering the lower surface of the substrate 110 is formed. Thereafter, the wiring recess PDH connected to the through hole TVH is formed by removing a portion of the lower insulating layer 105 and the dummy buried rail DPR is removed through the wiring recess PDH and the through hole TVH. Because the dummy buried rail DPR is removed, the limited space RCH may be defined in the first power hole PRH by the first insulating barrier BPR. The through hole TVH may be connected to the limited space RCH.

The through hole TVH may be formed to have a tapered shape in which a horizontal width thereof decreases from a lower side thereof toward an upper side thereof in the vertical direction (Z direction). The through hole TVH may be formed to decrease in horizontal width toward the limited space RCH. That is, the through hole TVH and the limited space RCH may be formed to decrease in horizontal width toward each other.

Referring to FIGS. 21 and 22 together, after forming a wiring barrier PDBa covering inner side surfaces of the through hole TVH and the wiring recess PDH, a power wiring line PDLa, a through electrode TSV, and the buried rail PR are formed to fill the wiring recess PDH, the through hole TVH, and the limited space RCH. In some embodiments, the buried rail PR, the through electrode TSV, and the power wiring line PDLa may be integrally formed as a single body. For example, the buried rail PR, the through electrode TSV, and the power wiring line PDLa may include the same material. Because the buried rail PR is formed to fill the limited space RCH PDH, the buried rail PR may be formed to be connected to the power via PV through self-alignment. Also, because the through electrode TSV is formed to fill the through hole TVH, the through electrode TSV may be formed to be connected to the buried rail PR through self-alignment. The through electrode TSV may pass through the substrate 110. The power wiring line PDLa, the through electrode TSV, the buried rail PR, and the power via PV may constitute a power transmission network.

The through electrode TSV may be formed to have a tapered shape in which a horizontal width thereof decreases from a lower side thereof toward an upper side thereof in the vertical direction (Z direction). The through electrode TSV may be formed to decrease in horizontal width toward the buried rail PR. That is, the through electrode TSV and the buried rail PR may be formed to decrease in horizontal width toward each other.

The power wiring line PDLa may be formed to have a tapered shape in which a horizontal width thereof decreases from a lower side thereof toward an upper side thereof in the vertical direction (Z direction). The power wiring line PDLa may be formed to decrease in horizontal width toward the through electrode TSV.

Figure 23:
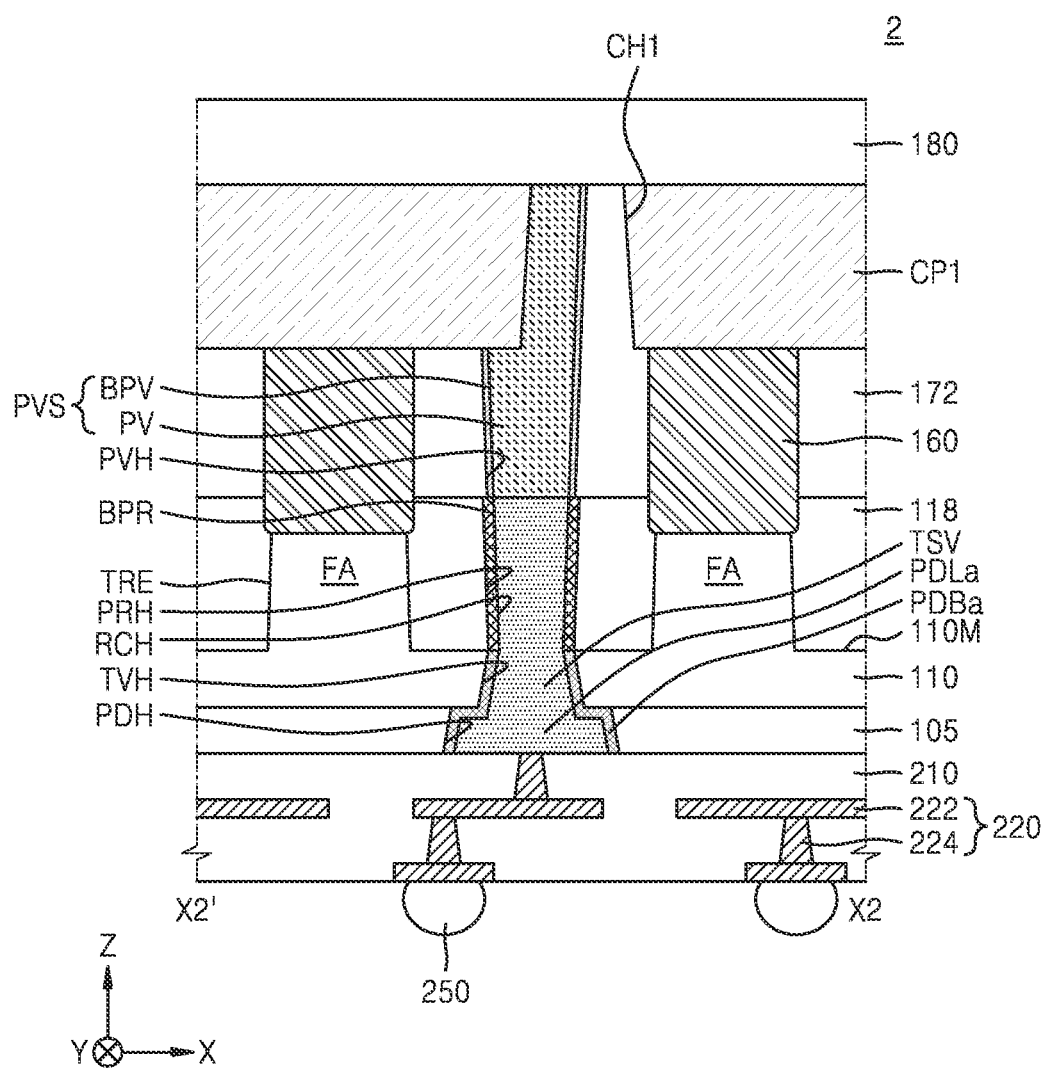
FIG. 23 is a cross-sectional view illustrating an integrated circuit device according to embodiments.

FIG. 23 is a cross-sectional view illustrating an integrated circuit device according to embodiments. Specifically, FIG. 23 is a cross-sectional view taken along a position corresponding to the line X2-X2' of FIG. 1A.

Referring to FIG. 23, the inter-wiring insulating layer 210 and the wiring structure 220 including the wiring line 222 and the wiring via 224 may be formed below the lower insulating layer 105 and the power wiring line PDLa. The inter-wiring insulating layer 210 may surround at least portions of the wiring line 222 and the wiring via 224. A portion of the wiring line 222 may be exposed on the lower surface of the inter-wiring insulating layer 210. The portion of the wiring line 222 that is exposed on the lower surface of the inter-wiring insulating layer 210 may function as an external connection pad. The external connection terminal 250 may be attached to the portion of the wiring line 222 that is exposed on the lower surface of the inter-wiring insulating layer 210 and functions as an external connection pad.

In an integrated circuit device 2 according to embodiments, power provided through the external connection terminal 250 may be supplied to the source/drain region 160 through the power wiring line PDLa, the through electrode TSV, the buried rail PR, the power via PV, and the first conductive plug CPL.

Figure 24:
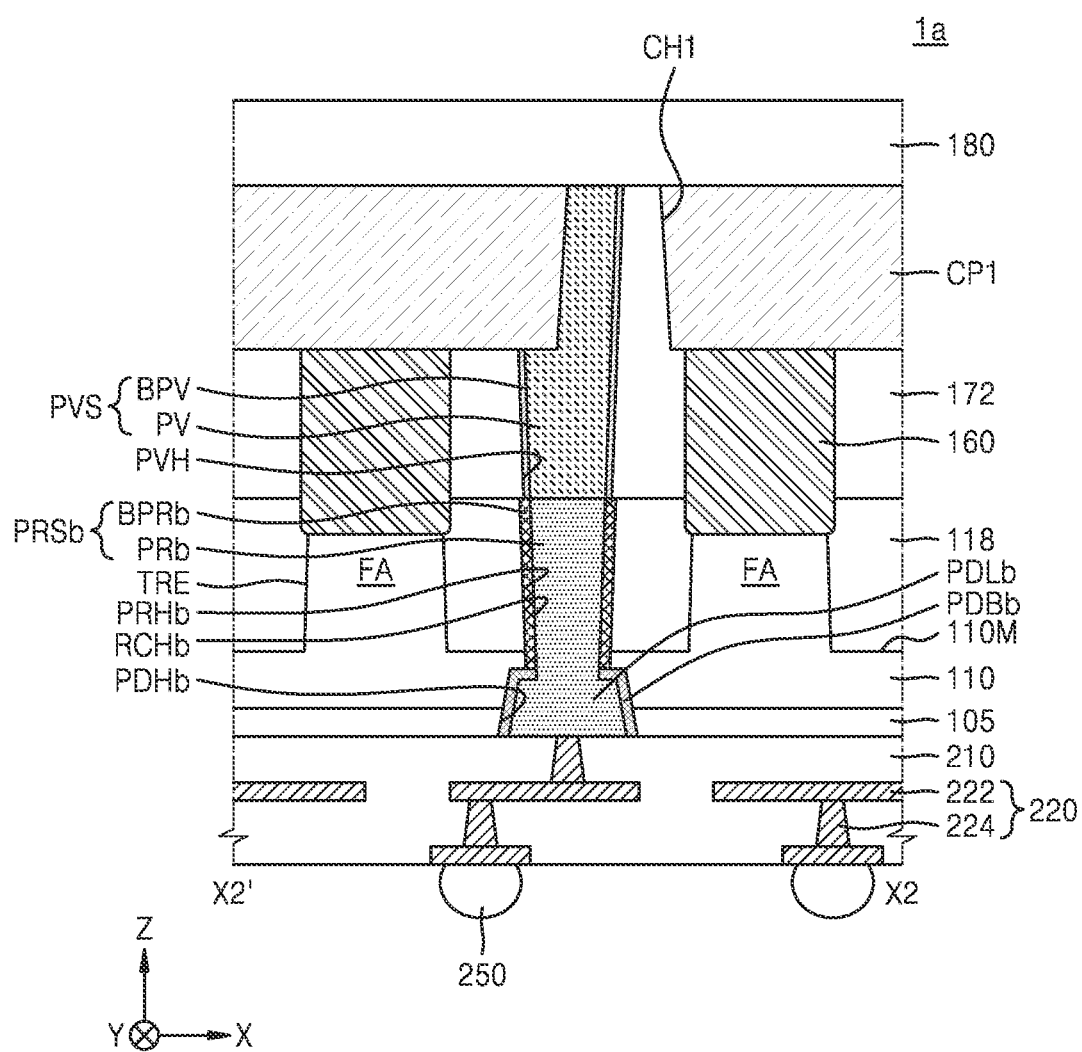
FIG. 24 is a cross-sectional view illustrating an integrated circuit device according to embodiments.

FIG. 24 is a cross-sectional view illustrating an integrated circuit device according to embodiments. Specifically, FIG. 24 is a cross-sectional view taken along a position corresponding to the line X2-X2' of FIG. 1A.

Referring to FIG. 24, the integrated circuit device 1a may include a rail structure PRSb and a power wiring line PDLb, instead of the rail structure PRS and the power wiring line PDL included in the integrated circuit device 1 shown in FIG. 18.

The rail structure PRSb may include a first insulating barrier BPRb and a buried rail PRb. A first power hole PRHb may extend into the substrate 110 through the device separation layer 118. For example, the first power hole PRHb may pass through the device separation layer 118 and may extend into the substrate 110 to pass through an upper portion of the substrate 110. The first insulating barrier BPRb may cover inner surfaces of the first power hole PRHb. The first insulating barrier BPRb may define a limited space RCHb in the first power hole PRHb. The buried rail PRb may fill the limited space RCHb. The buried rail PRb may pass through the device separation layer 118 and may extend into the substrate 110 to pass through an upper portion of the substrate 110.

A wiring recess PDHb may pass through the lower insulating layer 105 and a lower portion of the substrate 110. The wiring recess PDHb may be connected to the first power hole PRHb. The power wiring line PDLb and a wiring barrier PDBb may fill the wiring recess PDHb. The wiring barrier PDBb may be between the power wiring line PDLb and the lower insulating layer 105 and between the power wiring line PDLb and the lower portion of the substrate 110.

In some embodiments, the buried rail PRb and the power wiring line PDLb may be integrally formed as a single body. For example, the buried rail PRb and the power wiring line PDLb may include the same material. The power wiring line PDLb, the buried rail PRb, and the power via PV may constitute a power transmission network.

Figure 25:
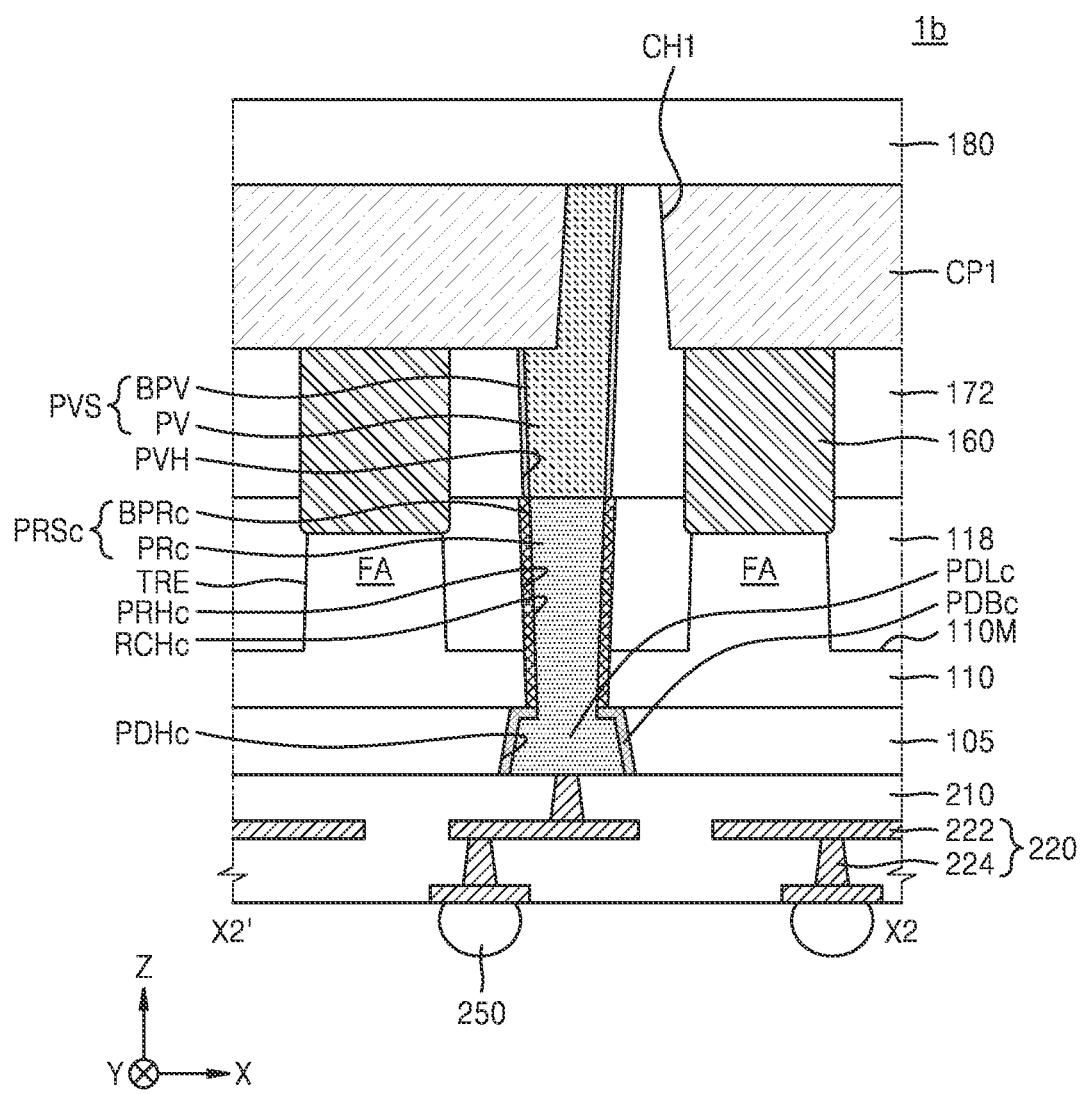
FIG. 25 is a cross-sectional view illustrating an integrated circuit device according to embodiments.

FIG. 25 is a cross-sectional view illustrating an integrated circuit device according to embodiments. Specifically, FIG. 25 is a cross-sectional view taken along a position corresponding to the line X2-X2' of FIG. 1A.

Referring to FIG. 25, the integrated circuit device 1b may include a rail structure PRSc and a power wiring line PDLc, instead of the rail structure PRS and the power wiring line PDL included in the integrated circuit device 1 shown in FIG. 18.

The rail structure PRSc may include a first insulating barrier BPRc and a buried rail PRc. A first power hole PRHc may extend into the substrate 110 through the device separation layer 118. For example, the first power hole PRHc may pass through the device separation layer 118 and the substrate 110. The first insulating barrier BPRc may cover inner surfaces of the first power hole PRHc. The first insulating barrier BPRc may define a limited space RCHc in the first power hole PRHc. The buried rail PRc may fill the limited space RCHc. The buried rail PRc may pass through the device separation layer 118 and may extend into the substrate 110 to pass through the substrate 110.

A wiring recess PDHc may pass through the lower insulating layer 105. The wiring recess PDHc may be connected to the first power hole PRHc. The power wiring line PDLc and a wiring barrier PDBc may fill the wiring recess PDHc. The wiring barrier PDBc may be between the power wiring line PDLc and the lower insulating layer 105. In some embodiments, the wiring barrier PDBc may be between the power wiring line PDLc and the lower surface of the substrate 110.

In some embodiments, the buried rail PRc and the power wiring line PDLc may be integrally formed as a single body. For example, the buried rail PRc and the power wiring line PDLc may include the same material. The power wiring line PDLc, the buried rail PRc, and the power via PV may constitute a power transmission network.

While the disclosure has been particularly shown and described with reference to embodiments thereof, it will be understood that various changes in form and details may be made therein without departing from the spirit and scope of the following claims.

What is claimed is:

1. An integrated circuit device comprising:
   a substrate having a front surface and a rear surface, opposite to each other, and a fin-type active region defined by a trench in the front surface;
   a device separation layer filling the trench;
   a source/drain region on the fin-type active region;
   a first conductive plug arranged on the source/drain region and electrically connected to the source/drain region;
   a power wiring line at least partially arranged on the rear surface of the substrate;
   a buried rail connected to the power wiring line through the device separation layer and decreasing in horizontal width toward the power wiring line; and
   a power via connecting the buried rail to the first conductive plug,
   wherein a width of an uppermost end of the buried rail is equal to or smaller than a width of a lowermost end of the power via.

2. The integrated circuit device of claim 1, wherein the power wiring line decreases in horizontal width toward the buried rail.

3. The integrated circuit device of claim 1, further comprising:
   a plurality of gate electrodes extending to cross the fin-type active region; and
   an inter-gate insulating layer covering the source/drain region and filling between the plurality of gate electrodes, wherein
   the power via passes through the inter-gate insulating layer and decreases in horizontal width toward the buried rail.

4. The integrated circuit device of claim 3, further comprising:
   a first power hole passing through the device separation layer;
   a first insulating barrier covering inner side surfaces of the first power hole and surrounding the buried rail;
   a second power hole passing through the inter-gate insulating layer; and
   a second insulating barrier covering inner side surfaces of the second power hole and surrounding the power via.

5. The integrated circuit device of claim 4, wherein a width of an uppermost end of the first power hole is greater than a width of a lowermost end of the second power hole.

6. The integrated circuit device of claim 4, wherein a thickness of the first insulating barrier on the inner side surfaces of the first power hole is greater than a thickness of the second insulating barrier on the inner side surfaces of the second power hole.

7. The integrated circuit device of claim 4, wherein the power via extends from the second power hole into the first power hole.

8. The integrated circuit device of claim 1, wherein the buried rail and the power wiring line are integrally formed as a single body.

9. The integrated circuit device of claim 1, further comprising:
   a through electrode passing through the substrate and connecting between the power wiring line and the buried rail, wherein
   the buried rail and the through electrode decrease in horizontal width toward each other.

10. The integrated circuit device of claim 9, wherein the buried rail, the through electrode, and the power wiring line are integrally formed as a single body.

11. An integrated circuit device comprising:
    a substrate having a front surface and a rear surface, opposite to each other, and a fin-type active region defined by a trench in the front surface;
    a device separation layer filling the trench;
    a source/drain region on the fin-type active region;
    a plurality of gate electrodes extending to cross the fin-type active region;
    an inter-gate insulating layer covering the source/drain region and filling between the plurality of gate electrodes;
    a first conductive plug arranged on the source/drain region and electrically connected to the source/drain region;
    a power wiring line at least partially arranged on the rear surface of the substrate;
    a first power hole passing through the device separation layer;
    a first insulating barrier covering inner side surfaces of the first power hole with a first thickness;
    a buried rail surrounded by the first insulating barrier and electrically connected to the power wiring line;
    a second power hole passing through the inter-gate insulating layer;
    a second insulating barrier covering inner side surfaces of the second power hole with a second thickness that is less than the first thickness; and
    a power via surrounded by the second insulating barrier and connecting the buried rail to the first conductive plug.

12. The integrated circuit device of claim 11, wherein each of the first power hole and the second power hole has a tapered shape in which a horizontal width thereof decreases from an upper side thereof toward a lower side thereof in a vertical direction.

13. The integrated circuit device of claim 12, wherein the buried rail and the power wiring line decrease in horizontal width toward each other and are integrally formed as a single body with each other.

14. The integrated circuit device of claim 11, wherein all portions of an uppermost end of the buried rail contact portions of a lowermost end of the power via.

15. The integrated circuit device of claim 11, wherein:
    a width of an uppermost end of the first power hole is greater than a width of a lowermost end of the second power hole, and
    a width of an uppermost end of the buried rail is equal to or smaller than a width of a lowermost end of the power via.

16. The integrated circuit device of claim 11, wherein:

an uppermost end of the first insulating barrier contacts a lowermost end of the second insulating barrier at a first vertical level, and a lowermost end of the power via contacts an uppermost end of the buried rail in the first power hole at a second vertical level that is lower than the first vertical level.

17. An integrated circuit device comprising:

a substrate having a front surface and a rear surface, opposite to each other, and a fin-type active region defined by a trench in the front surface;

a device separation layer filling the trench;

a source/drain region on the fin-type active region;

a plurality of gate electrodes extending to cross the fin-type active region;

an inter-gate insulating layer covering the source/drain region and filling between the plurality of gate electrodes;

a first conductive plug arranged on the source/drain region and electrically connected to the source/drain region;

a power wiring line at least partially arranged on the rear surface of the substrate;

a first power hole passing through the device separation layer;

a first insulating barrier covering inner side surfaces of the first power hole with a first thickness;

a buried rail surrounded by the first insulating barrier and electrically connected to the power wiring line;

a second power hole passing through the inter-gate insulating layer;

a second insulating barrier covering inner side surfaces of the second power hole with a second thickness that is less than the first thickness; and a power via surrounded by the second insulating barrier, connecting the buried rail to the first conductive plug, and decreasing in horizontal width toward the buried rail, wherein the buried rail and the power wiring line decrease in horizontal width toward each other.

18. The integrated circuit device of claim 17, further comprising:

a nanosheet stacked structure having a plurality of nanosheets arranged apart from each other in a vertical direction on an upper surface of the fin-type active region, wherein:

each of the plurality of gate electrodes includes a main gate portion and a plurality of sub-gate portions, the main gate portion covering an upper surface of the nanosheet stacked structure, and the plurality of sub-gate portions being connected to the main gate portion and formed in spaces between the plurality of nanosheets and the fin-type active region.

19. The integrated circuit device of claim 17, further comprising:

a through hole passing through the substrate; and a through electrode filling the through hole, connecting between the power wiring line and the buried rail, and decreasing in horizontal width toward the through electrode, wherein the buried rail, the through electrode, and the power wiring line are integrally formed of a same material as a single body.

20. The integrated circuit device of claim 17, wherein a width of an uppermost end of the buried rail is equal to or smaller than a width of a lowermost end of the power via.

\* \* \* \* \*